United States Patent [19]
Baker et al.

[11] Patent Number: 5,978,417
[45] Date of Patent: Nov. 2, 1999

[54] ADAPTIVE CABLE EQUALIZER

[75] Inventors: Alan J. Baker, Loveland, Colo.; Marc H. Ryat, Santa Clara, Calif.

[73] Assignee: National Semiconductor Corporation, Santa Clara, Calif.

[21] Appl. No.: 08/713,626

[22] Filed: Sep. 13, 1996

Related U.S. Application Data

[60] Provisional application No. 60/012,126, Feb. 23, 1996.

[51] Int. Cl.[6] .............................. H03H 7/30; H03H 5/00; G03G 11/04; G06F 17/10
[52] U.S. Cl. ......................... 375/232; 375/229; 375/230; 375/233; 333/18; 333/24 R; 333/28 R; 364/724.19
[58] Field of Search ..................................... 375/232, 229, 375/233, 235, 230; 333/18, 24 R, 28 R; 364/724.19, 724.2, 724.011

[56] References Cited

U.S. PATENT DOCUMENTS

| | | | |
|---|---|---|---|
| 5,124,673 | 6/1992 | Hershberger | 333/18 |
| 5,257,286 | 10/1993 | Ray | 375/232 |
| 5,670,916 | 9/1997 | Korn | 333/28 R |
| 5,699,022 | 12/1997 | Tovar | 333/18 |

OTHER PUBLICATIONS

S. Webster, E. Fankhauser, K. Chen, J. Francis, E. Ioszef, T. Rosati, I. Ridpath and P. Moore, "A New Chip Set for Proposed SMPTE Standard SMPTE 259M–Serial Digital Interface", SMPTE Journal, Sep. 1993, pp. 777–785.

*Primary Examiner*—Chi H. Pham
*Assistant Examiner*—Khai Tran
*Attorney, Agent, or Firm*—Limbach & Limbach L.L.P.

[57] ABSTRACT

An adaptive cable equalizer is provided with a simple architecture, wherein a single control structure: controls the adaptation of the filter for compensating for cable length while simultaneously compensating for process and temperature variations; optimizes the SNR at any cable length by controlling biasing current sources; and uses a two-stage architecture which eliminates start-up problems and optimizes output levels to obtain optimal dc restoration while simultaneously allowing for independent optimization of the output levels of the recovered data in accordance with other requirements as desired. An analog adaptive equalizing filter is used for accurately synthesizing the inverse transfer function of cables of variable lengths. Data rates up to and beyond 400 Mbps are supported and the adaptive behavior automatically compensates for different cable lengths as well as process variations (with respect to the process(es) used for fabricating the equalizer in a monolithic form) and temperature variations.

50 Claims, 14 Drawing Sheets

ADAPTIVE CABLE EQUALIZER

RELATED APPLICATIONS

This application claims the benefit of U.S. Provisional Application No. 60/012,126, filed Feb. 23, 1996, and entitled "Adaptive Cable Equalizer."

BACKGROUND OF THE INVENTION

1. Field of the Invention

The present invention relates to interface circuits for receiving high data rate signals from long lengths of cable, and in particular, interface circuits for receiving high data rate, baseband, binary encoded data signals from long lengths of cable.

2. Description of the Related Art

Recovering data which has been transmitted over a long length of cable at high rates requires that such data be equalized in order to compensate for the loss and phase dispersion of the cable. Further, in those applications where the cable length may vary, such equalization must be based upon a complementary transfer function which is capable of adapting accordingly since the transfer function of the cable varies with the length of the cable. This equalizing is generally done using three functions: a filter function; a dc restoration and slicing function; and an adaptation control, or servo, function.

The filter function is performed using a complementary (with respect to the complex cable loss characteristic) filter which synthesizes the inverse of the transfer function of the cable. Since the bit error rate (BER) is directly related to jitter, an important performance metric for an equalizer is jitter within the output waveform. The extent to which the equalizer is able to match the inverse of the complex cable loss characteristic determines the extent to which inter-symbol interference induced jitter is eliminated.

Conventional equalizers use gm/C types of continuous time filters or finite impulse response (FIR) filters. However, these types of filter structures tend to be complex and have difficulty maintaining the required balance among the desired operating characteristics, such as output jitter, compensation for process and temperature variations, and optimization of the signal-to-noise ratio (SNR).

As for the dc restoration and slicing function, referring to FIG. 1, it is well known that ac coupling a digital data stream with variations in pattern density creates baseline wander. For example, if the waveform labelled 'A' is presented to the input of the RC ac coupling network, then the waveform labelled 'B' results. If the waveform has finite rise times, then the baseline wander will cause jitter in the output. The output jitter arises because a comparator connected to 'B' will slice the data at different amplitude points along the waveform edges, and the finite rise and fall times of such edges translate the amplitude slicing variations to timing variations.

Referring to FIG. 2, one conventional technique for eliminating baseline wander is to use a quantized feedback circuit as shown. The simple architecture of such a circuit provides positive feedback around the comparator so that very little charging current flows through the ac coupling capacitor. In other words, the comparator provides its own dc restoration.

Referring to FIG. 3, there is, however, a start-up problem associated with the use of quantized feedback. For example, if the comparator starts out in a state opposite that of the input state, then the output may never transition between states at all because the ac coupled input never crosses the comparator threshold. This situation is aggravated by sparse patterns of the type as shown in FIG. 3.

As for the adaptation control, or servo, function, conventional adaptive equalizers use a peak detection technique in which a control voltage is produced which is proportional to the pulse height of the equalized data signal. However, such a peak detection servo is sensitive to amplitude errors in the incoming data signal.

SUMMARY OF THE INVENTION

In accordance with the present invention, an adaptive cable equalizer is provided with a simple equalizing filter architecture, wherein a single control structure controls the adaptation of the filter for compensating for cable length while simultaneously compensating for process and temperature variations, and optimizes the SNR at any cable length by controlling biasing current sources. Further, this adaptive cable equalizer uses a two-stage quantized feedback architecture which eliminates start-up problems and optimizes output levels to obtain optimal dc restoration while simultaneously allowing for independent optimization of the output levels of the recovered data in accordance with other requirements as desired. Further still, a servo section compares the edges of the output signals from the filter and comparator to generate an adaptive control signal.

An adaptive cable equalizer in accordance with one embodiment of the present invention incorporates an analog adaptive equalizing filter for accurately synthesizing the inverse transfer function of cables ranging in length from zero meters to lengths which attenuate the signal by 40 decibels (dB) at 200 megahertz (MHz). (This corresponds to approximately 300 meters of Belden 8281 cable or 120 meters of CAT5 UTP cable.) Data rates up to and beyond 400 megabits per second (Mbps) are supported and the adaptive behavior automatically compensates for different cable lengths as well as process variations (with respect to the process(es) used for fabricating the equalizer in a monolithic form) and temperature variations. In one embodiment, measured peak-to-peak jitter in the recovered data after equalizing data transmitted through 200 meters of Belden 8281 cable at 270 Mbps was less than 200 picoseconds (ps) peak-to-peak.

These and other features and advantages of the present invention will be understood upon consideration of the following detailed description of the invention and the accompanying drawings.

DETAILED DESCRIPTION OF THE INVENTION

Figure 4:
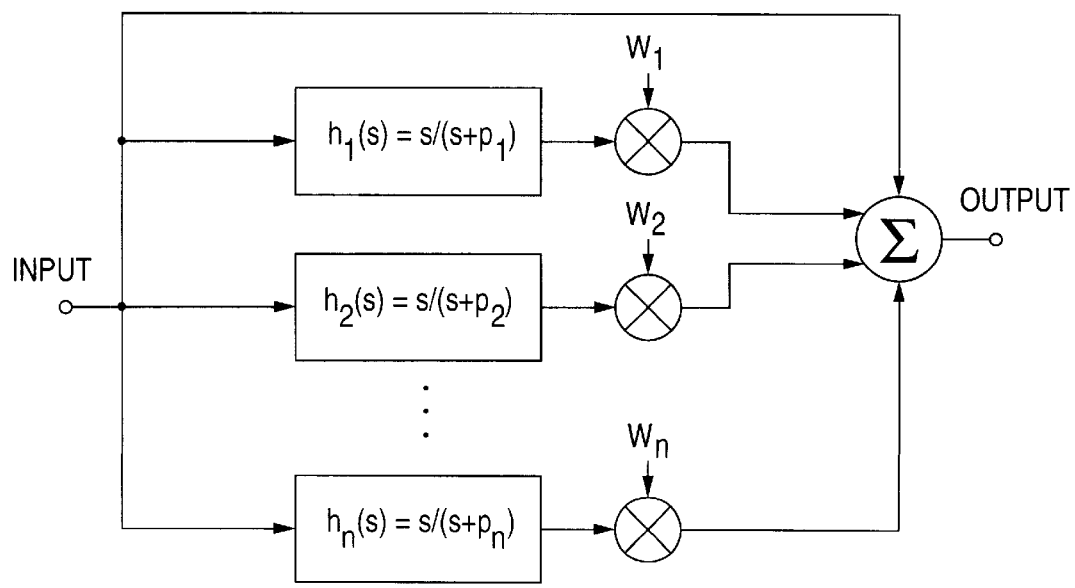
FIG. 4 is a functional block diagram of an adaptive filter structure for synthesizing an inverse filter for an adaptive cable equalizer.

Referring to FIG. 4, in accordance with one embodiment of the present invention, an inverse filter for a cable equalizer provides programmable frequency boost to synthesize the inverse cable response. A unity gain signal path is summed with several weighted high pass filter signal paths. At zero cable length, all of the weights $W_i$ are set to zero and only the unity gain path is active. At increasing cable lengths, the outputs of the high pass filters $h_i(s)$ are weighted in some optimum fashion to provide the necessary frequency boost.

The equation approximating the cable loss characteristic is $$C(f) = e^{-klf^{1/2}} e^{-jklf^{1/2}}$$

where k is a constant set by the cable, l is the cable length, and f is frequency. This equation yields the familiar cable attenuation result: the attenuation in dB is proportional to the square-root of the frequency. The slope of the attenuation curve derived from this equation is $-1.15A$ dB per decade, where A is the cable attenuation at a point on the curve. Thus, at the point where the cable attenuation is 40 dB, the slope of the response is $-46$ dB per decade. In one embodiment of the present invention, the equalizing filter employs a cascade of two identical filters, each approximating $[C(f)]^{-1/2}$. Each stage has a maximum response slope of +20 dB per decade. Consequently, the cascade of two stages begins to depart from the inverse cable attenuation characteristic at the point where the cable attenuation is 40 dB.

The architecture for a single equalizing filter stage as shown in FIG. 4 is capable of adaptively synthesizing $[C(f)]^{-1/2}$. Each $h_i(s)$ block is a high pass filter, with a zero at the origin and a pole at $p_i$. The $p_i$ singularities are spaced uniformly on a log frequency axis. In a sense, the equalizing filter stage is a set of high pass basis functions which may be weighted and summed to construct an arbitrary filter response. Adapting the filter to varying cable lengths can be accomplished by adjusting the $W_i$ weights. In order to simplify the adaptation of the filter each $W_i$ weight is fixed for the optimum response at the maximum cable length and a single weight is applied to the entire filter section. The value of such a single weight, $\alpha$, ranges from zero to unity as the total cable length ranges from zero to a maximum. This approach results in slightly less than optimum filter performance at intermediate cable lengths, but still yields excellent performance with a simple topology.

Figure 5:
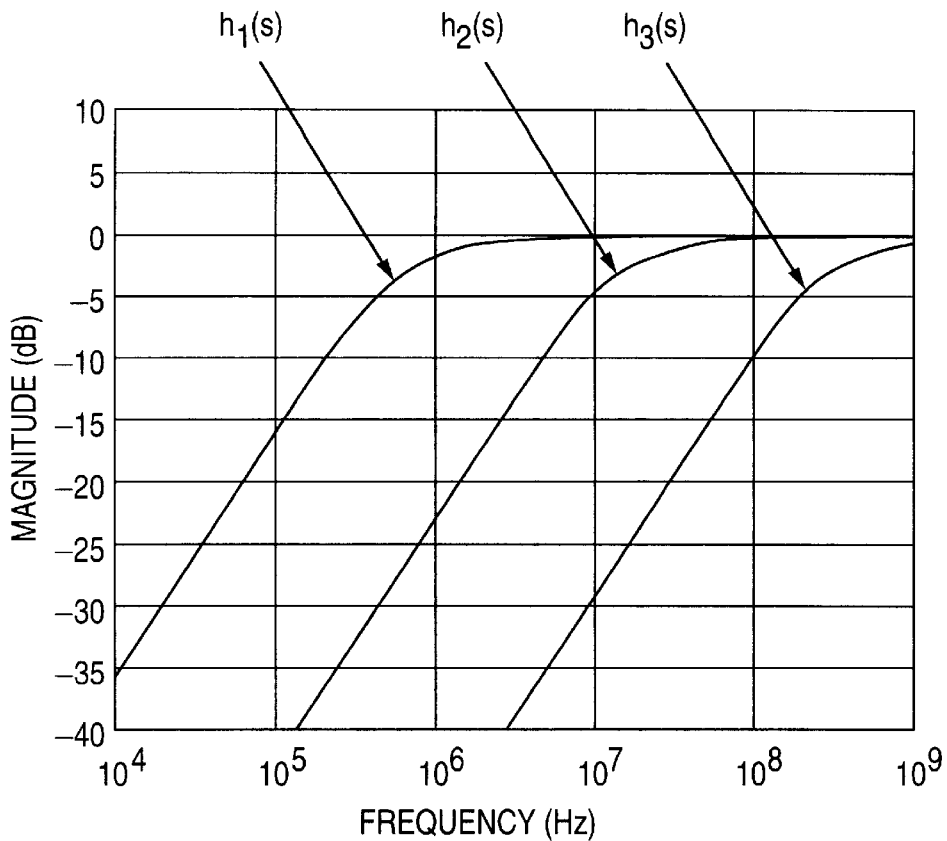
FIG. 5 is a graph representing the transfer functions of three high pass filters as used in an adaptive cable equalizer in accordance with one embodiment of the present invention.

Referring to FIG. 5, three high pass filters are used, the corner frequencies of which are spaced on a log frequency axis as shown. In the discussion that follows these will be referred to as the low-band $[h_1(s)]$, mid-band $[h_2(s)]$ and high-band $[h_3(s)]$ filters.

Figure 6:
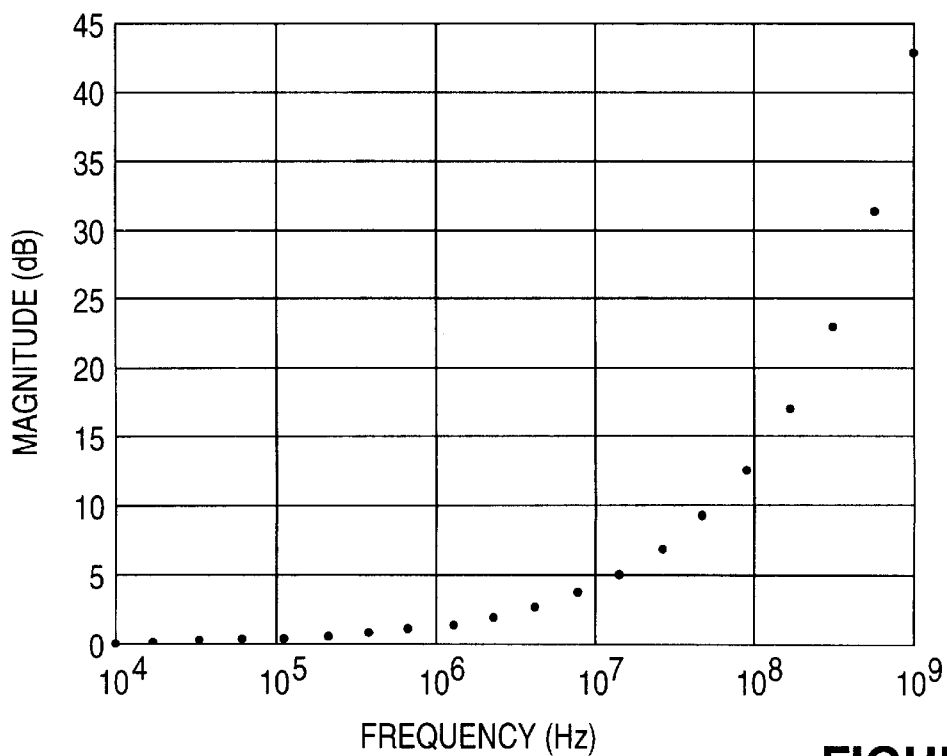
FIG. 6 is a graph of an inverse magnitude response for 150 meters of Belden 8281 cable.
Figure 7:
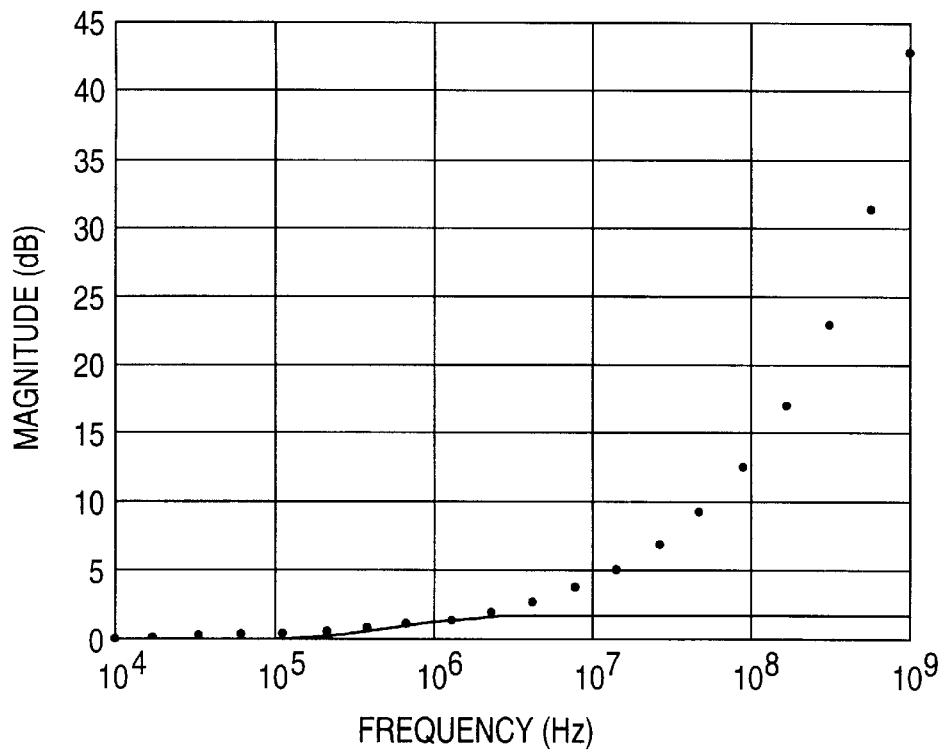
FIG. 7 is a graph of an exemplary low-band synthesis of the inverse cable response.
Figure 8:
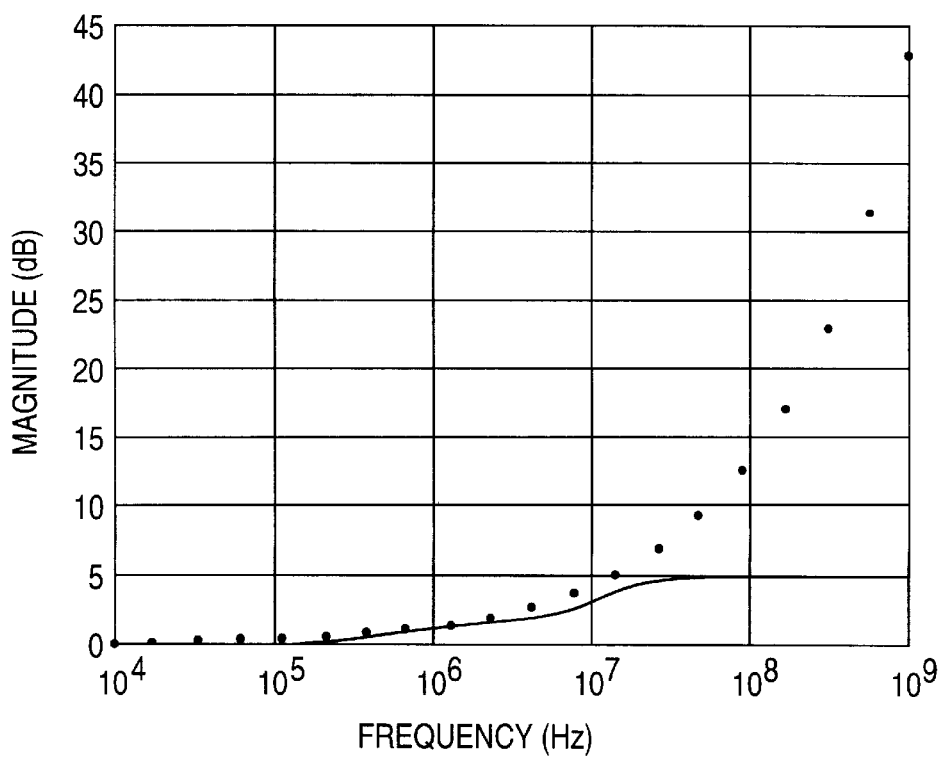
FIG. 8 is a graph of an exemplary low-band and mid-band synthesis of the inverse cable response.
Figure 9:
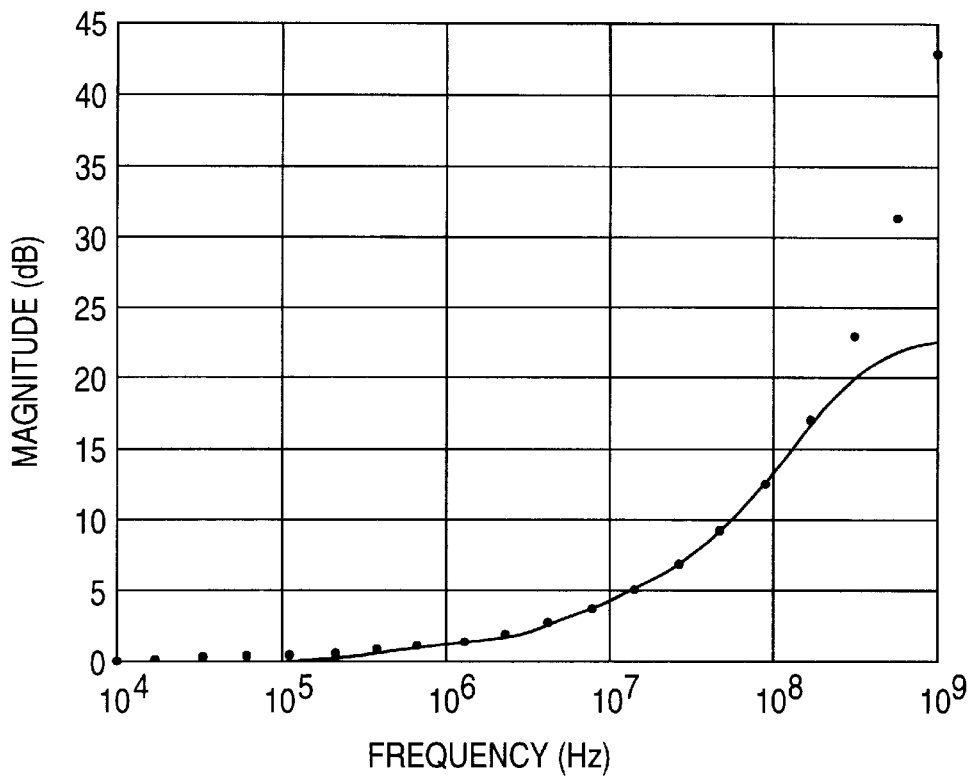
FIG. 9 is a graph of an exemplary low-band, mid-band and high-band synthesis of the inverse cable response.

Referring to FIG. 6, with an inverse magnitude response for 150 meters of Belden 8281 cable being as shown, then with the weight $W_1$ for the low-band filter $[h_1(s)]$ set at 0.2 and the remaining weights $W_2$, $W_3$ set at zero, the low frequency response of the cable is approximated as shown in FIG. 7. Adding 0.62 times ($W_2$) the mid-band filter $[h_2(s)]$ improves the synthesis out to the mid frequency range as shown in FIG. 8. Adding 12.1 times ($W_3$) the high-band filter $[h_3(s)]$ provides a good approximation to the inverse response out to about 200 MHz as shown in FIG. 9.

The maximum response slope achievable with this architecture (FIG. 4) is 20 dB per decade. Synthesizing the inverse response of up to 300 meters of cable, which is the objective, e.g. for Belden 8281 cable, requires a maximum response slope of 40 dB per decade at about 200 MHz. Thus, using two identical cascaded filter sections, each synthesizing the inverse response for a maximum of 150 meters of cable length, will produce an equalizer capable of compensating for up to 300 meters of cable. It should be understood that further filter sections could be used to synthesize the inverse response for even longer lengths of cable.

The optimum weights $W_i$ are those which provide minimum jitter in the recovered output data. Not accounting for noise induced jitter effects, the more accurately the equalizer synthesizes the inverse cable response, the lower the jitter. Optimum weights $W_i$ for the high pass filters $h_i(s)$ are those weights $W_i$ which minimize the error in the inverse response in some fashion. In practice, it is generally best to minimize the mean square error on a log frequency scale (as opposed to a linear frequency scale). The derivation of the optimum weights $W_i$ may be performed using well known techniques (e.g. linear algebra) to minimize the inverse response error.

Figure 10:
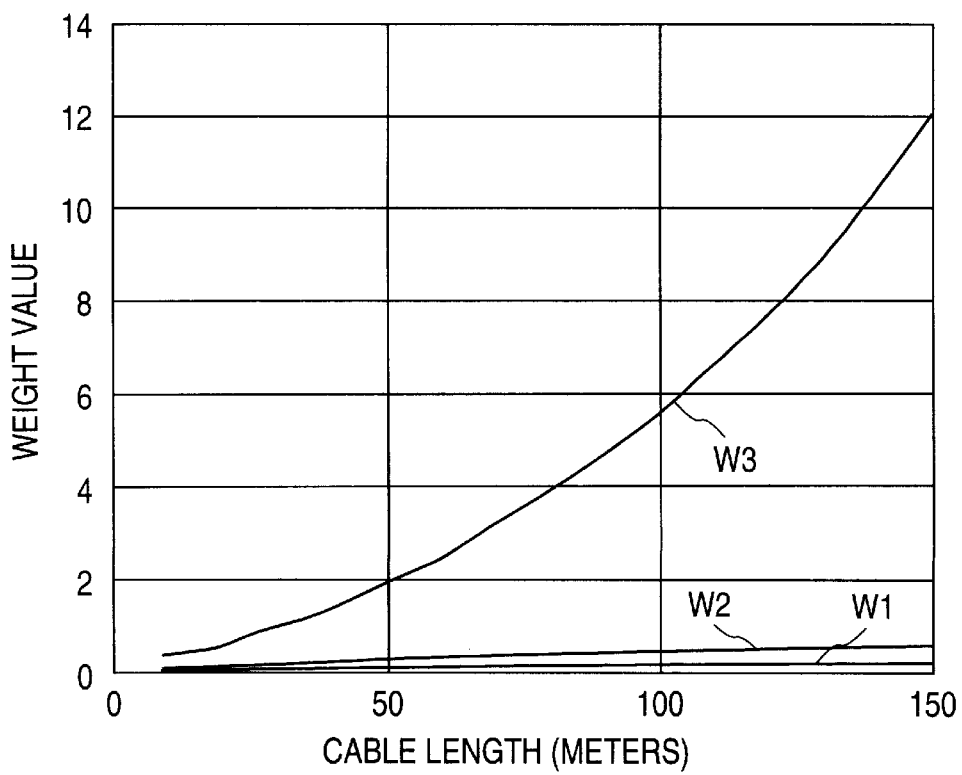
FIG. 10 is a graph of the optimum weights derived for one adaptive filter section in an adaptive cable equalizer in accordance with one embodiment of the present invention for cable lengths ranging from zero to 150 meters (Belden 8281).

Referring to FIG. 10, the optimum weights derived for one adaptive filter section for cable lengths ranging from zero to 150 meters are as shown. The first weight $W_1$ is that for the low-band filter $h_1(s)$, the second weight $W_2$ is that for the mid-band filter $h_2(s)$ and the third weight $W_3$ is that for the high-band filter $h_3(s)$.

Figure 11:
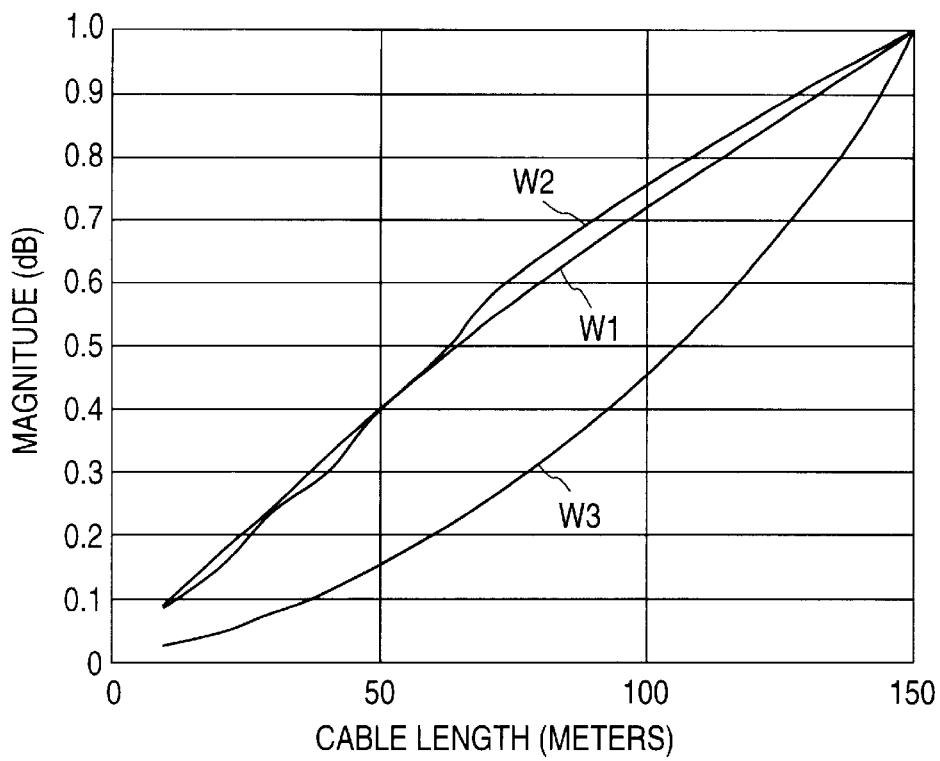
FIG. 11 is a graph of three weights after being normalized to their respective values at a cable length of 150 meters.

Referring to FIG. 11, the plot shown results if the three weights $W_1$, $W_2$, $W_3$ are normalized to their respective values at a cable length of 150 meters. The vertical axis now ranges from a value of zero at zero cable length, to a value of one at 150 meters.

Figure 12:
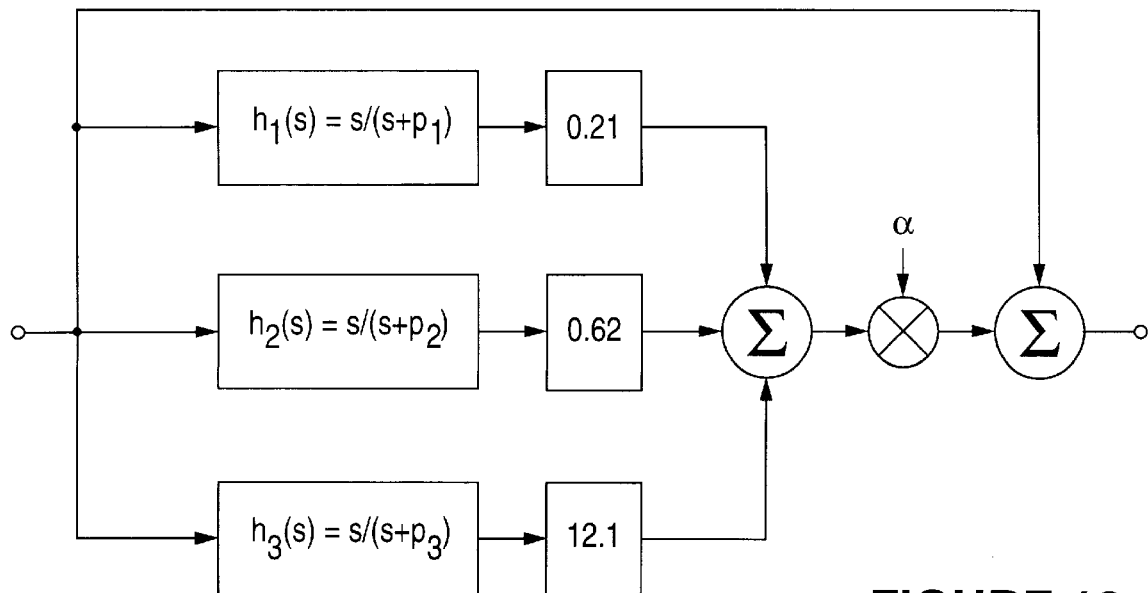
FIG. 12 is a functional block diagram of an inverse filter for an adaptive cable equalizer in accordance with one embodiment of the present invention.

Referring to FIG. 12, if the normalized weights (FIG. 11) followed identical trajectories, then independent weighting of the filters $h_i(s)$ would not be necessary and the architecture as shown could be used instead. As shown, each filter $h_i(s)$ is weighted with a fixed weight which is the optimum weight for 150 meters of cable ($W_1=0.21$, $W_2=0.62$ and $W_3=12.1$, per the discussion above) and the outputs are summed. A single weight, alpha ($\alpha$), is then applied. This weight a ranges from a value of zero, for zero cable length, to a value of one, for a cable length of 150 meters. This single programmable weight structure results in a much simpler overall circuit topology than would result from one using the three independent weights.

Figure 13:
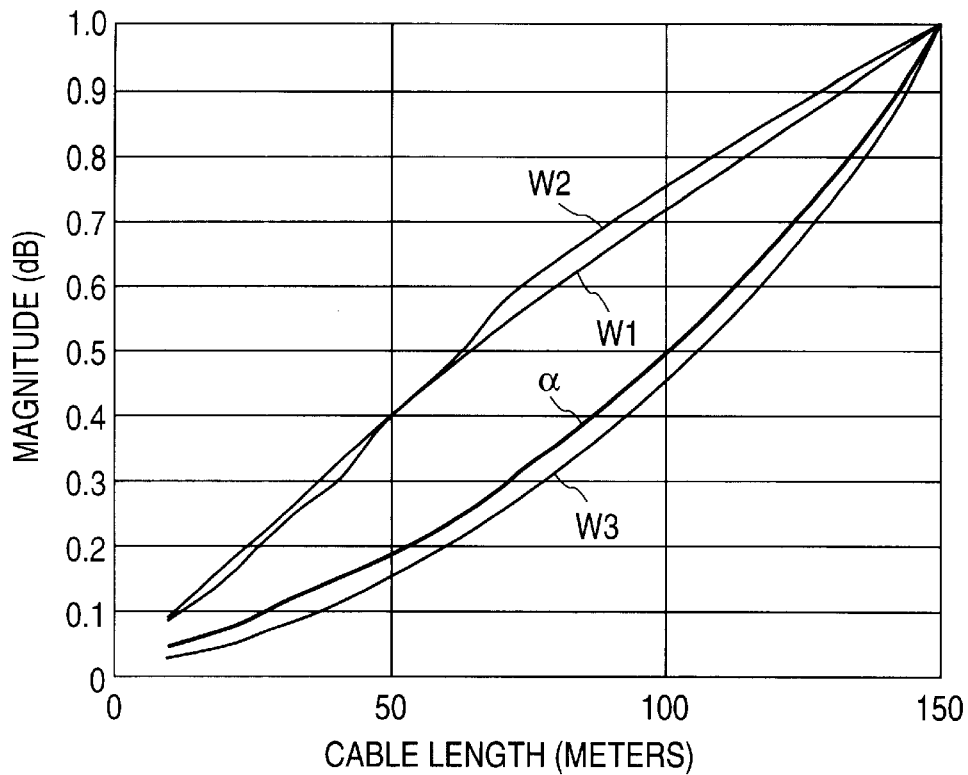
FIG. 13 is a graph of the three weights after being normalized to their respective values at a cable length of 150 meters with the optimum weight $\alpha$ for the single weight structure superimposed.

Referring to FIG. 13, the optimum weight a (which minimizes the mean square response error) for the single weight structure is shown superimposed on the optimum normalized weights previously derived. The single weight $\alpha$ tends to track the high-band filter weight $W_3$ with a bias towards the low-band $W_1$ and mid-band $W_2$ weights. While such filter weighting is somewhat suboptimum at medium cable lengths, simulations have shown that this results in only a small increase in jitter at medium cable lengths relative to that resulting from the use of optimum weights $W_i$. Hence, the simplification in circuit topology which results from this architecture warrants such a slight increase in jitter at moderate cable lengths.

Figure 14:
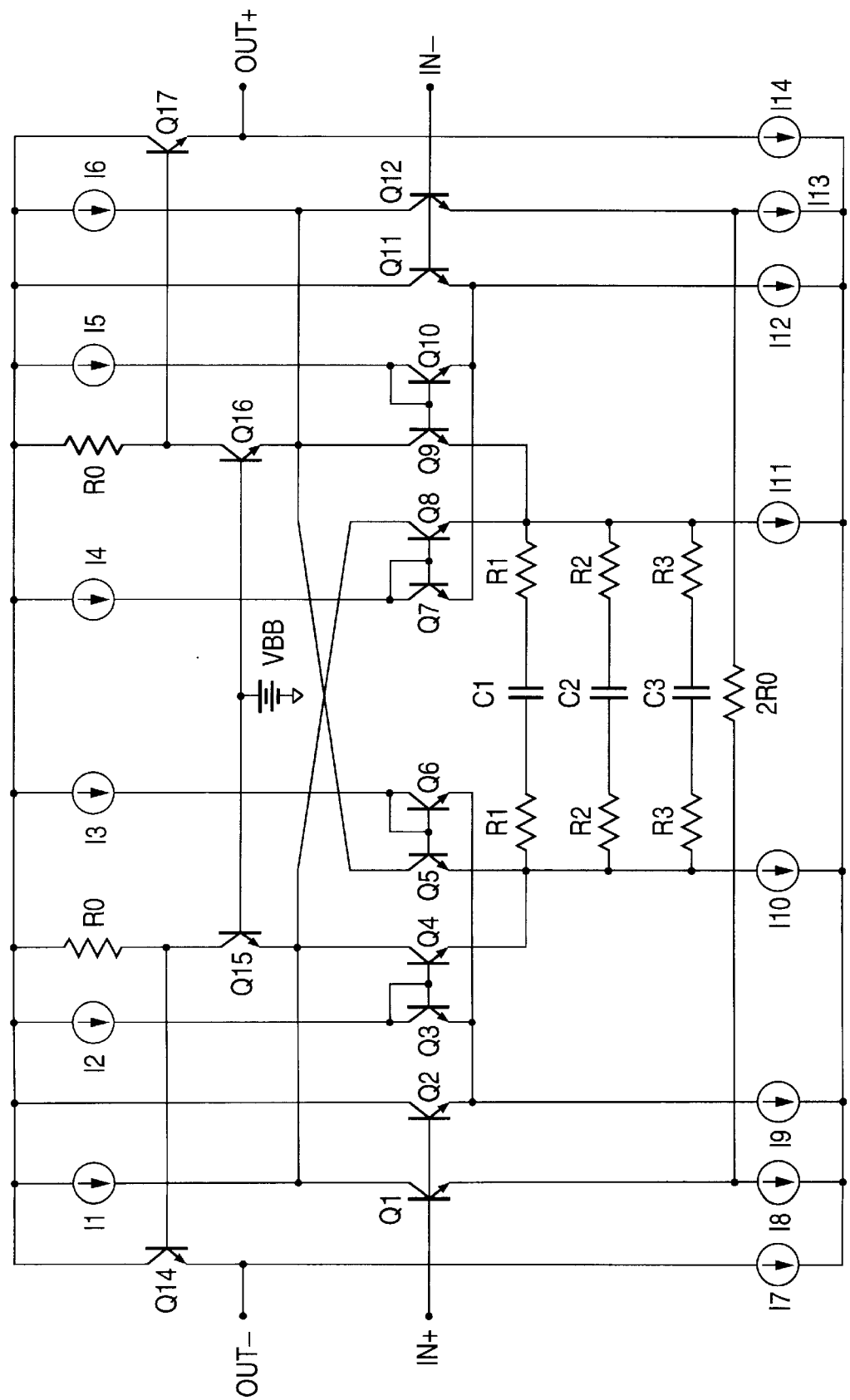
FIG. 14 is a schematic diagram of adaptive filter circuitry for a fully differential implementation of an adaptive cable equalizer in accordance with one embodiment of the present invention.

Referring to FIG. 14, the adaptive filter circuitry for a fully differential implementation is as shown. The differential input phases IN+ and IN− are applied at the bases of transistors Q1/Q2 and Q11/Q12, respectively, and the differential output phases OUT− and OUT+ are taken off the emitters of buffer transistors Q14 and Q17, respectively.

Figure 15:
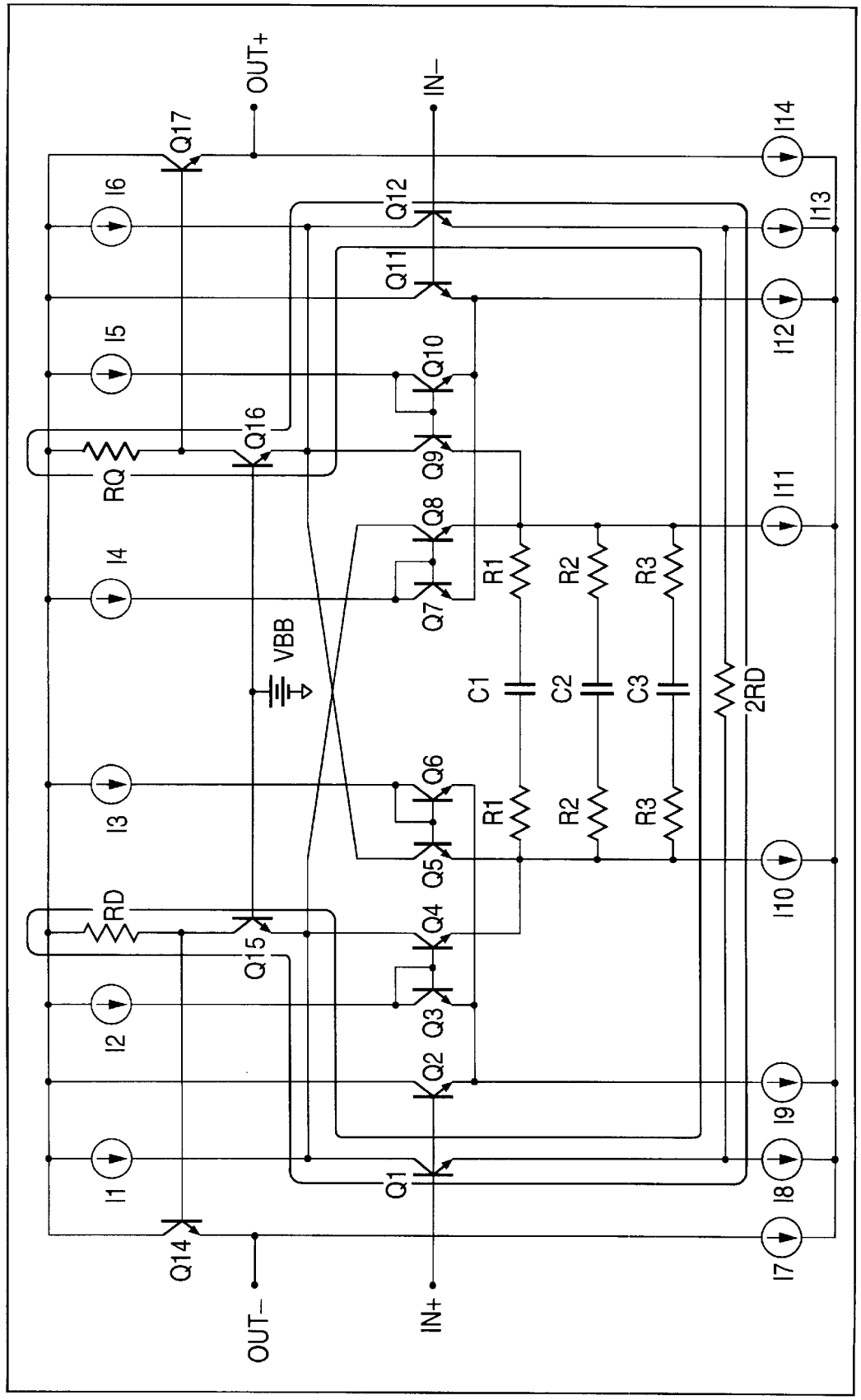
FIG. 15 is a schematic diagram of the adaptive filter circuitry of FIG. 14 with the unity gain signal path highlighted.

Referring to FIG. 15, the unity gain signal path in the circuit of FIG. 14 is highlighted. It is a cascoded, degenerated differential pair (composed of transistors Q1, Q12, Q15 and Q16, and resistors R0 and 2R0).

Figure 16:
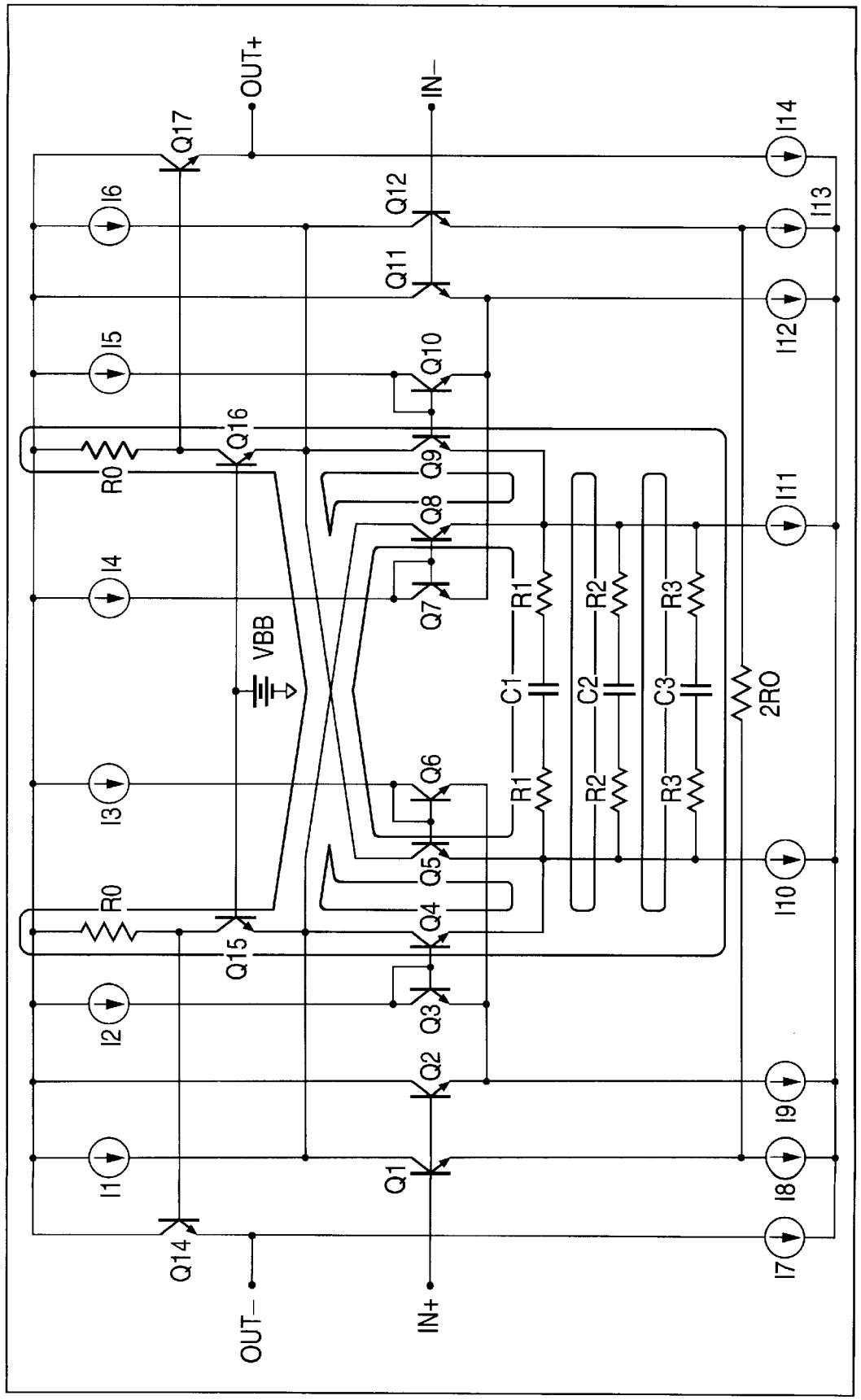
FIG. 16 is a schematic diagram of the adaptive filter circuitry of FIG. 14 with the weighted filter signal path highlighted.

Referring to FIG. 16, the weighted filter signal path in the circuit of FIG. 14 is highlighted. Three high-pass filters are implemented here (composed of transistors Q4, Q5, Q8, Q9, Q15 and Q16, resistors R0, R1, R2 and R3, and capacitors C1, C2 and C3). The high pass corner frequencies are set by the RC products of the resistors $R_n$ and capacitor $C_n$ in the three highlighted parallel branches. The fixed weights $W_i$ for the three high pass filters $h_i(s)$ are set by the resistance ratios of the collector resistor R0 to the resistors R1, R2, R3 in the three highlighted parallel branches.

Figure 17:
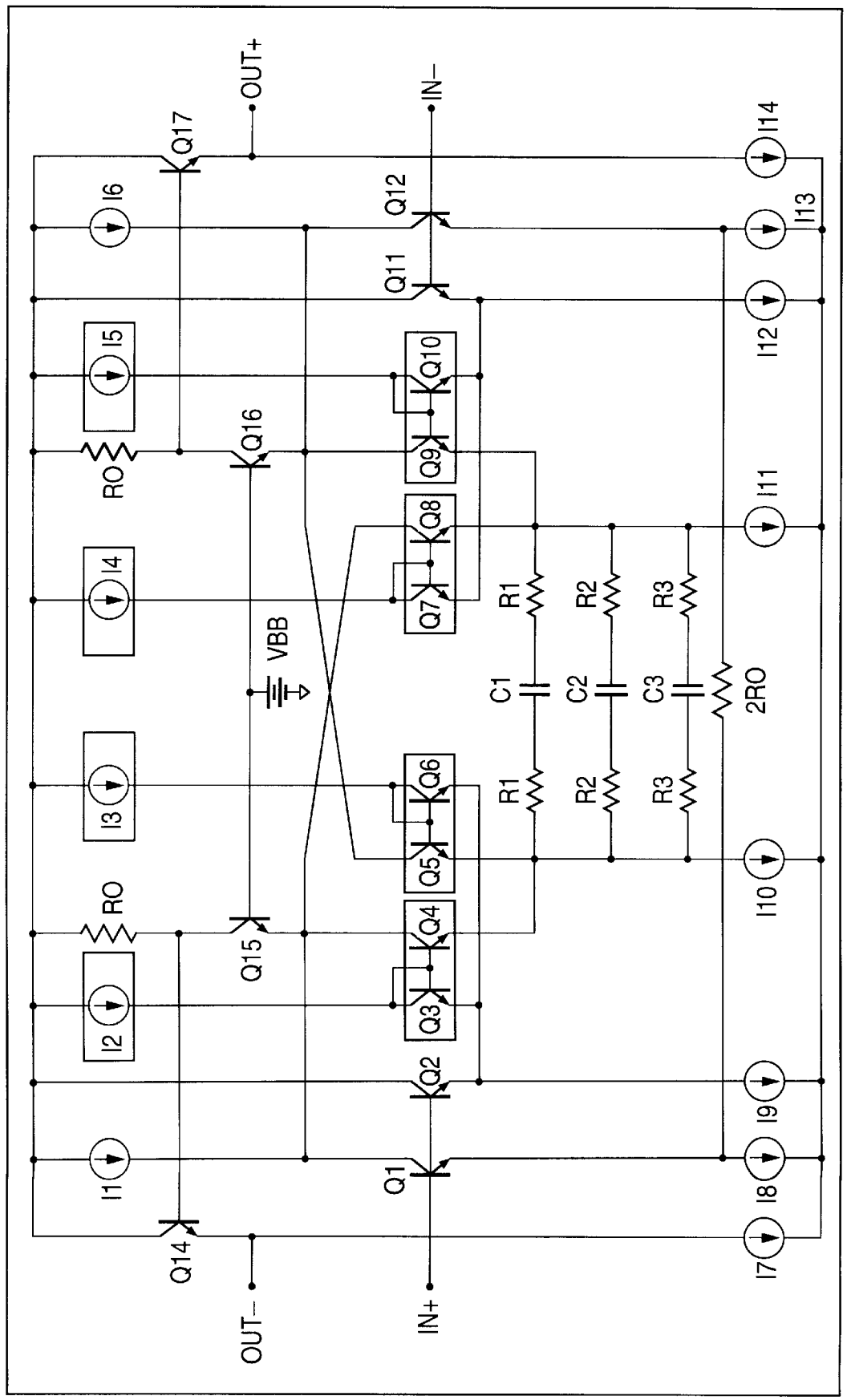
FIG. 17 is a schematic diagram of the adaptive filter circuitry of FIG. 14 with the four quadrant multiplier highlighted.

Referring to FIG. 17, the transistors highlighted form a four quadrant multiplier (composed of transistors Q3–Q10 and current sources I2–I5) for the programmable weighting of the high pass signal path. The highlighted current sources I2–I5 control the weighting coefficients $W_i$. The noise within the adaptive filter is dominated by the shot noise in the this multiplier.

Figure 18:
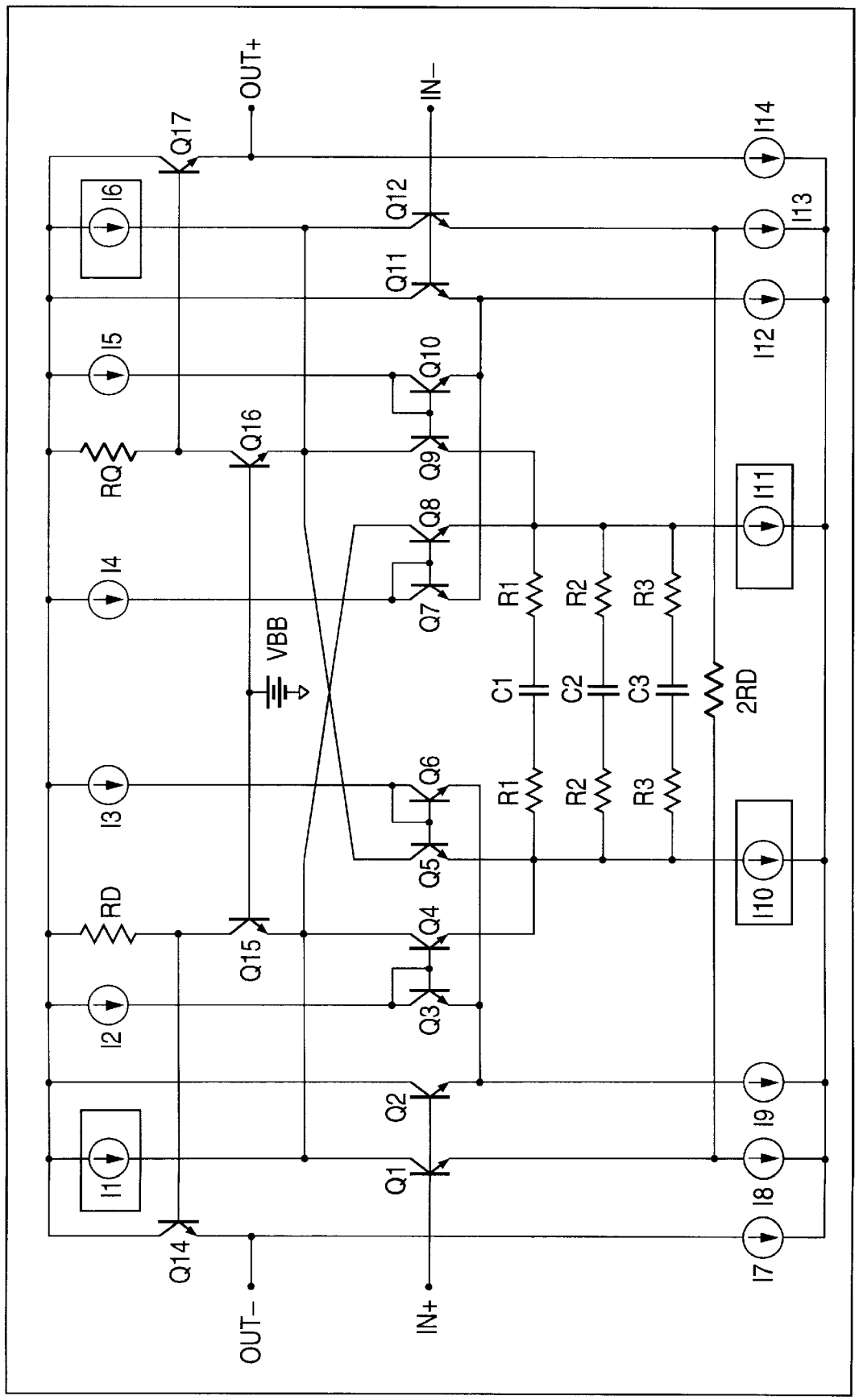
FIG. 18 is a schematic diagram of the adaptive filter circuitry of FIG. 14 with the biasing current sources highlighted.

Referring to FIG. 18, at short cable lengths the biasing current sources highlighted I1, I6, I10, I11 must be held to a relatively high value to support the fast edge rates that are associated with short cables. However, at short cable lengths the incident signal levels are large and noise is not a serious problem. As the cable length increases, the edge rates of the signals become slower due to the longer cable lengths. Therefore, the biasing currents I1, I6, I10, I11 may be decreased to reduce the additive noise. In this particular embodiment, the highlighted current sources I1, I6, I10, I11 are modulated in tandem with the filter weight control to optimize the SNR at any cable length.

The high pass singularities $P_1$, $P_2$, $P_3$, set by the aforementioned RC products, are subject to variation because of the absolute tolerances of the resistors R1, R2, R3 and capacitors C1, C2, C3 that set the high pass corners. In practice, the RC products may vary +/−20% over process variations (e.g. variations in those processes which affect all of these elements similarly, such as when the equalizer is fabricated as a monolithic device). For example, it can be shown that a shift in the location of the pole frequencies by a factor of 1/a corresponds to a shift in cable length by the square root of a. Therefore, the same adaptive control that adapts for cable length variations also adapts for process and temperature variations, i.e. as long as the singularities track one another over process and temperature, which is typically the case, the adaptive loop automatically compensates for the variations.

Figure 1:
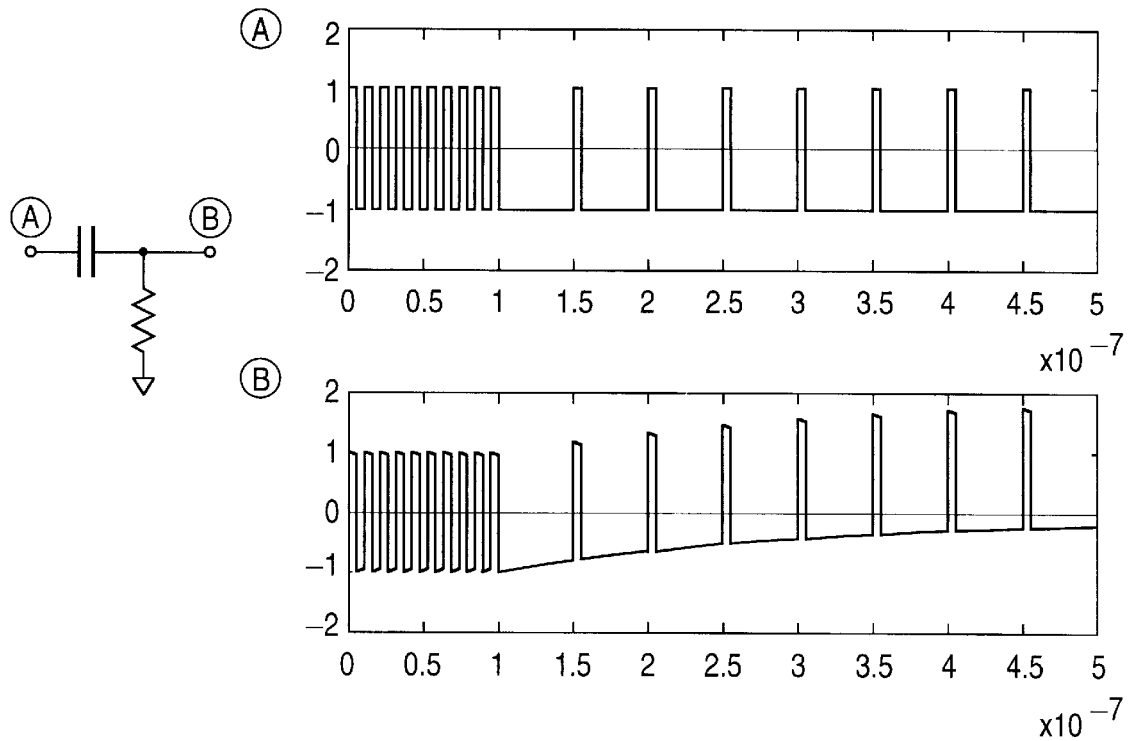
FIG. 1 illustrates exemplary input and output data signal waveforms for a conventional ac coupling circuit.
Figure 2:
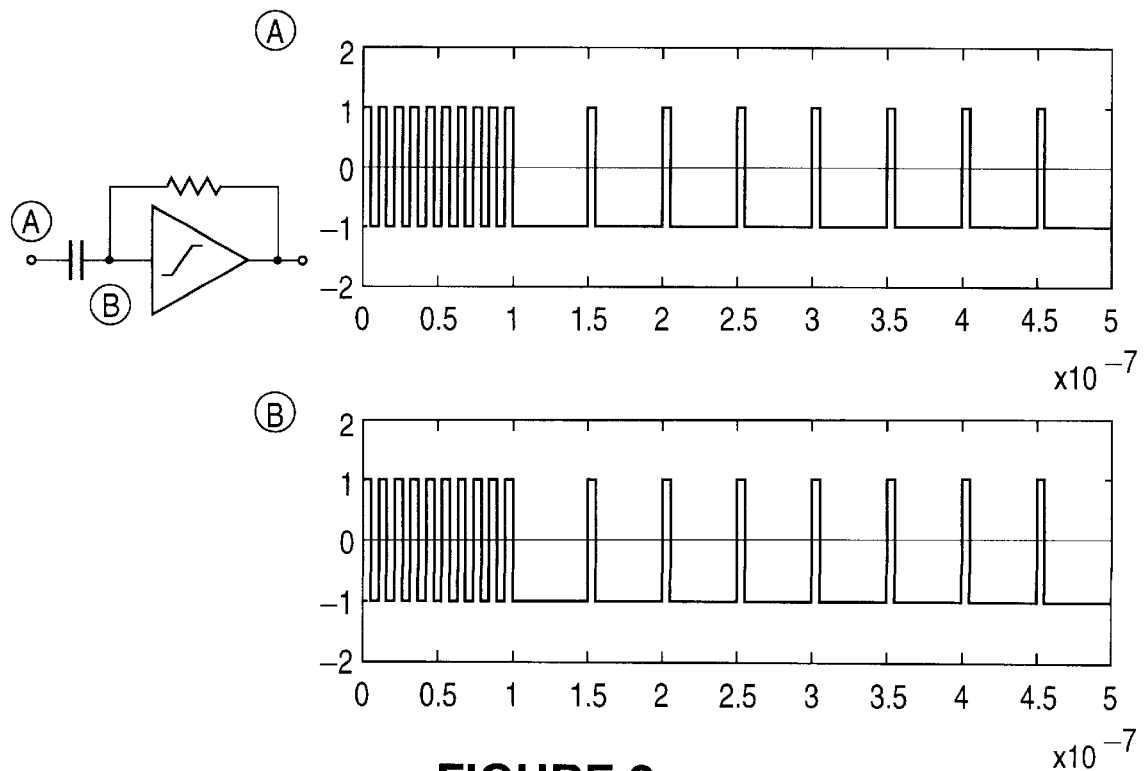
FIG. 2 illustrates exemplary input and output data signal waveforms for a conventional quantized feedback circuit.
Figure 3:
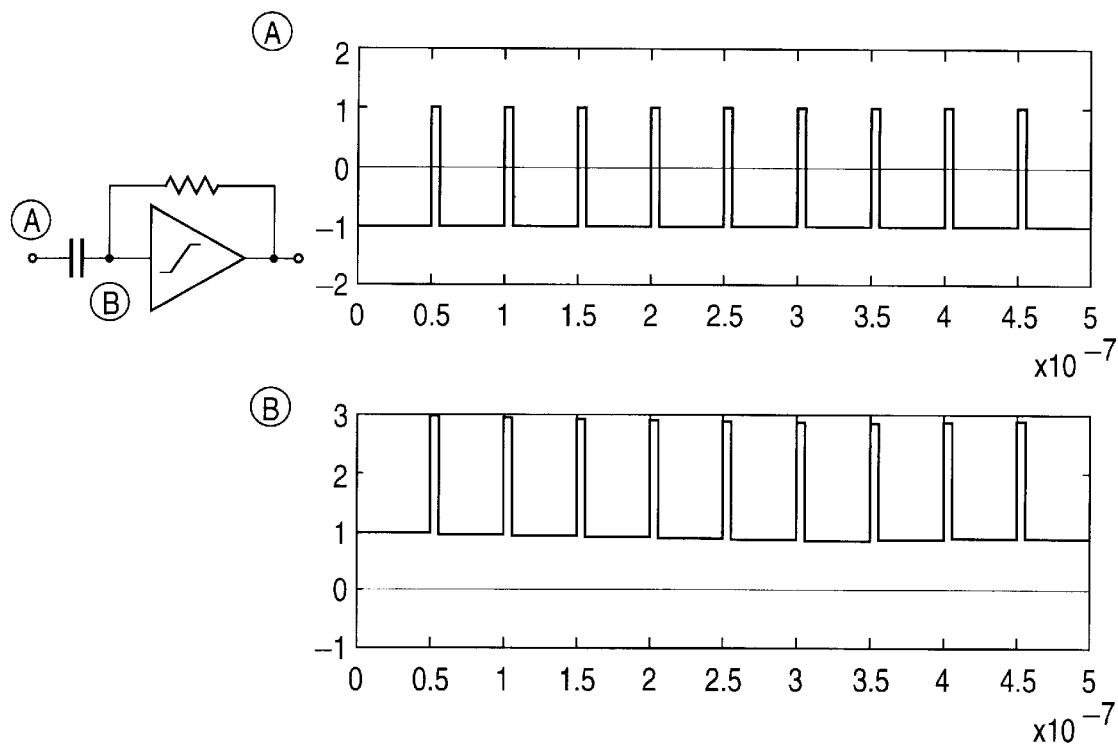
FIG. 3 illustrates exemplary input and output data signal waveforms for the conventional quantized feedback circuit of FIG. 2 when experiencing start-up problems.
Figure 19:
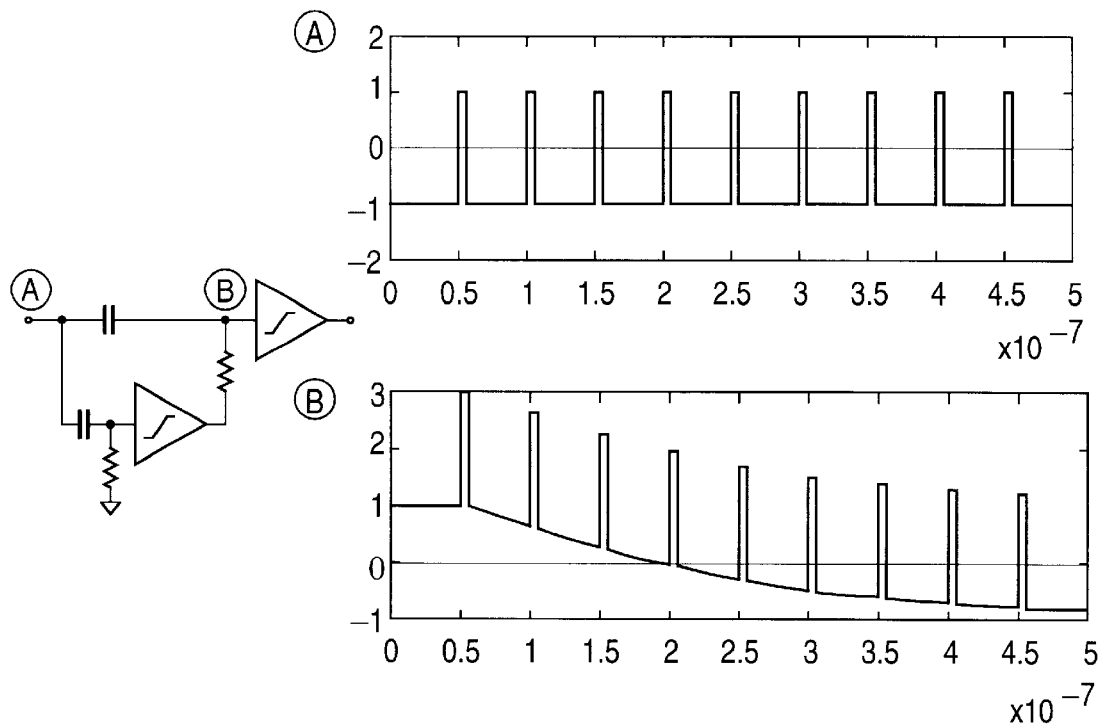
FIG. 19 is a schematic diagram of a two-stage quantized feedback architecture for an adaptive cable equalizer in accordance with one embodiment of the present invention.

Referring to FIG. 19, in accordance with one embodiment of the present invention, a two-stage quantized feedback architecture as shown circumvents the aforementioned start-up problem associated with simple quantized feedback architectures. Because there is no positive feedback around the first comparator, which is ac coupled and has self-biasing inputs, it is guaranteed to transition between states even during sparse patterns. While the first comparator may experiences baseline wander, its primary purpose is to provide an estimate of the dc coupled digital waveform, from which the dc content of the waveform may be extracted. The dc content in the waveform from the first comparator is summed with the ac coupled waveform to provide a dc restored signal for the second comparator. The dc content is relatively unaffected by jitter, so jitter at the output of the first comparator is unimportant. The second comparator slices the dc restored data. Also, even if the first comparator begins operation in the wrong state and produces the start-up transient as shown, this system, unlike the conventional system of FIG. 3, rapidly moves to the proper operating condition.

Figure 20:
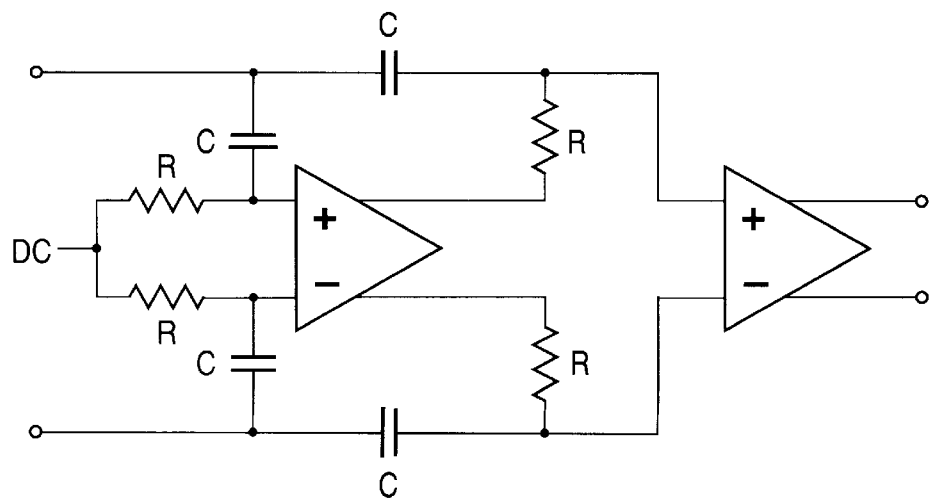
FIG. 20 is a schematic diagram of a full differential implementation of a two-stage quantized feedback comparator for use in an adaptive cable equalizer in accordance with one embodiment of the present invention.

Referring to FIG. 20, a full differential implementation of a two-stage quantized feedback comparator for use in the equalizer is as shown. As discussed above, the first comparator provides an estimate of the dc coupled waveform, from which the dc content is extracted and summed with the ac coupled waveform to produce a dc restored waveform. The dc restored waveform is sliced by the second comparator.

Figure 21:
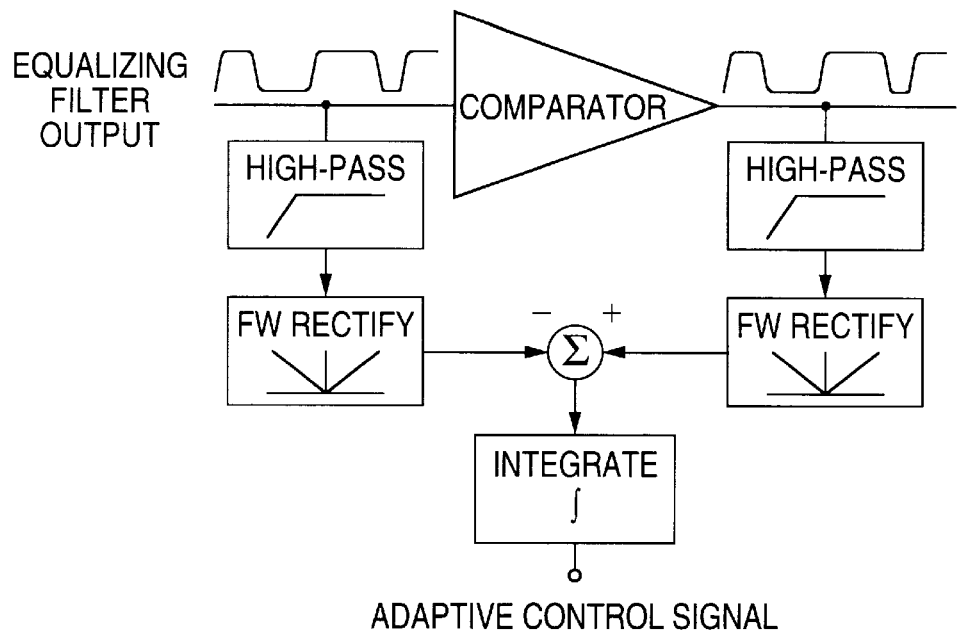
FIG. 21 is a functional block diagram of a servo block for use in an adaptive cable equalizer in accordance with one embodiment of the present invention.

Referring to FIG. 21, in accordance with one embodiment of the present invention, a servo block for comparing the edges of the signals at the comparator input and output in order to develop the control signal $\alpha$ for the equalizing filter is as shown. Two high pass filters, one in each signal path, effectively aperture the waveform edges. The outputs of the high pass filters are full wave rectified and then subtracted from one another. The result is integrated and fed back to the equalizing filter to complete the adaptive loop. Hence, whereas the equalizing filter and quantized feedback comparator establish the signal path, the servo establishes the control signal for adapting the equalizing filter to varying cable lengths. When properly equalized, the waveform at the comparator input (equalizing filter output) should "look like" the waveform at the comparator output. (It should be understood that the "comparator output" can be the output of either the first comparator, i.e. the dc coupled data estimate, or the second comparator, i.e. the sliced data. While the former may have more jitter than the latter, any such additional jitter makes no material difference since it is the characteristics of the signal edges which are of concern, not the relative timing between them.)

Figure 22:
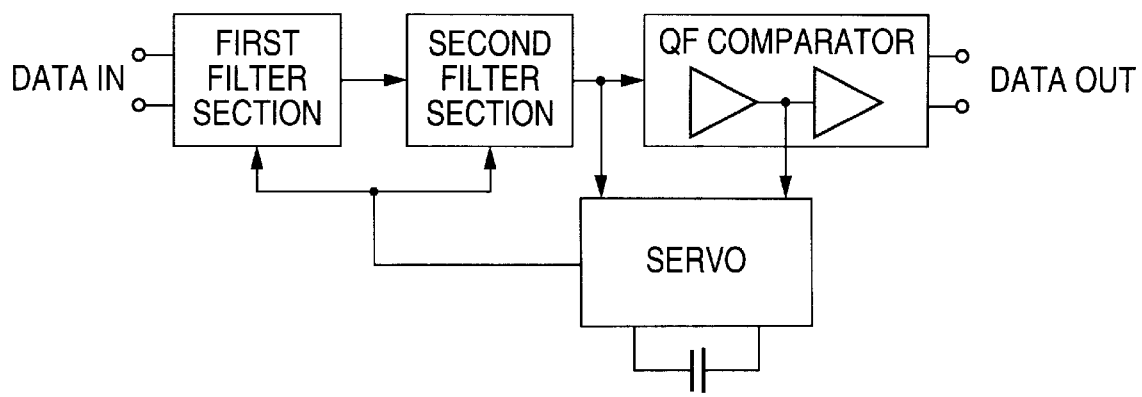
FIG. 22 is a functional block diagram of a full adaptive equalizer in accordance with one embodiment of the present invention.

Referring to FIG. 22, in accordance with the foregoing discussion, the full adaptive equalizer can be represented as shown. One embodiment of the equalizer has been fabricated in a 0.8 um/14 GHz BiCMOS process. The device consumes 58 mA of current and is powered by a single 5 Volt supply. A data sheet by the assignee, National Semiconductor Corporation, describing such device forms Appendix A and is incorporated herein by reference.

Figure 23:
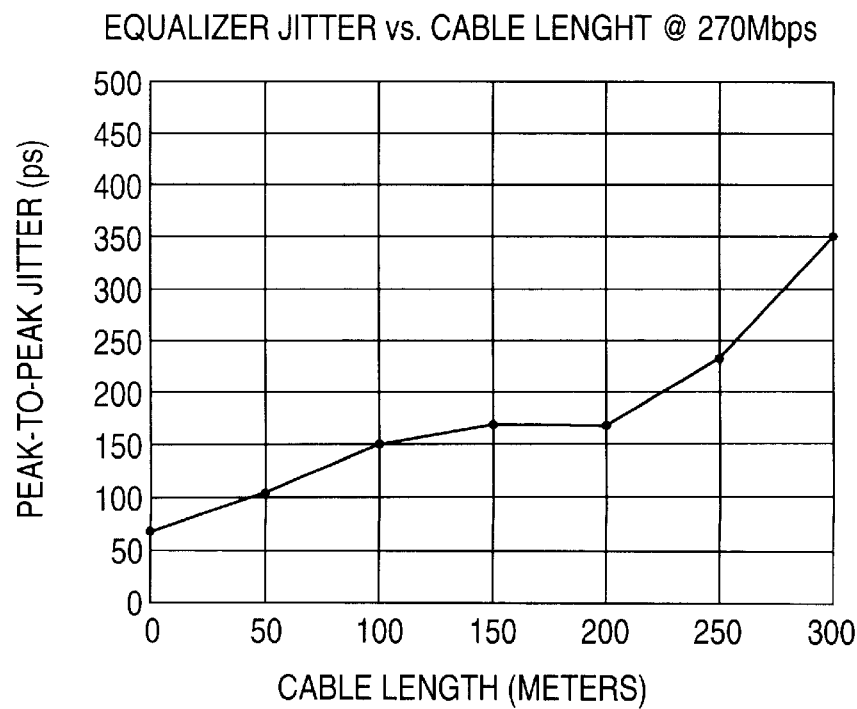
FIG. 23 is a graph of measured output jitter versus cable length at a data rate of 270 Mbps for an adaptive cable equalizer in accordance with one embodiment of the present invention.

Referring to FIG. 23, a plot is provided of the measured output jitter versus cable length at a data rate of 270 Mbps. In this case, peak-to-peak jitter is interpreted to mean six times the measured root mean square (RMS) jitter. At 200 meters the peak-to-peak jitter is less than 0.05 unit intervals and at 300 meters the peak-to-peak jitter is less than 0.1 unit intervals. Further improvements in inter-symbol interference induced jitter are possible by adding more filter singularities $p_i$ and by imposing more optimum control on the weighting of such singularities.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an adaptive equalizer system for use in adaptively equalizing and recovering data signals received via a communications path, said adaptive equalizer system comprising:

an adaptive filter circuit configured to receive an adaptation control signal and in accordance therewith receive, partition, filter, magnitude weight and recombine an input data signal corresponding to a plurality of data and in accordance therewith provide an equalized data signal corresponding to said plurality of data, wherein said input data signal is received via a communications path having a communications path transfer function associated therewith and, in accordance with said adaptation control signal, a frequency domain ratio of said equalized data signal to said input data signal represents an adaptive filter transfer function which is an approximate inverse of said communications path transfer function;

a multiple stage quantized feedback circuit coupled to said adaptive filter circuit, configured to receive and dc restore said equalized data signal and in accordance therewith provide a dc coupled data estimate signal and a dc restored equalized data signal, and configured to slice said dc restored equalized data signal and in accordance therewith provide a recovered digital data signal representing said plurality of data; and a servo control circuit coupled to said adaptive filter circuit and said multiple stage quantized feedback circuit and configured to receive therefrom said equalized data signal and one of said dc coupled data estimate and recovered digital data signals, respectively, configured to filter, rectify and combine said received equalized data signal and said received one of said dc coupled data estimate and recovered digital data signals and in accordance therewith provide a composite rectified signal, and configured to integrate said composite rectified signal and in accordance therewith provide said adaptation control signal.

2. The apparatus of claim 1, wherein said adaptive filter circuit comprises:

a plurality of magnitude weighted filter stages coupled in parallel, having a plurality of filter transfer functions associated therewith and configured to receive, filter and magnitude weight said input data signal and in accordance therewith provide a plurality of filtered and magnitude weighted data signals;

a first signal combiner coupled to said plurality of magnitude weighted filter stages and configured to receive and combine said plurality of filtered and magnitude weighted data signals and in accordance therewith provide a first composite filtered and magnitude weighted data signal;

a signal multiplier coupled to said first signal combiner and configured to receive and multiply said first composite filtered and magnitude weighted data signal and said adaptation control signal and in accordance therewith provide a second composite filtered and magnitude weighted data signal; and a second signal combiner coupled to said signal multiplier and configured to receive and combine said input data signal and said second composite filtered and magnitude weighted data signal and in accordance therewith provide a third composite filtered and magnitude weighted data signal as said equalized data signal.

3. The apparatus of claim 2, wherein said plurality of magnitude weighted filter stages, said first signal combiner, said signal multiplier and said second signal combiner together comprise:

a unity gain signal path configured to receive and buffer said input data signal and in accordance therewith provide a buffered data signal;

a weighted filter signal path configured to receive, filter and magnitude weight said input data signal and in accordance therewith provide said first composite filtered and magnitude weighted data signal;

a multiplier circuit coupled to said weighted filter signal path and configured to receive and multiply said adaptation control signal and said first composite filtered and magnitude weighted data signal and in accordance therewith provide said second composite filtered and magnitude weighted data signal; and an output circuit coupled to said unity gain signal path and said multiplier circuit and configured to receive and combine said buffered data signal and said second composite filtered and magnitude weighted data signal and in accordance therewith provide said third composite filtered and magnitude weighted data signal.

4. The apparatus of claim 3, wherein said multiplier circuit comprises:

a first plurality of variable current sources configured to receive said adaptation control signal and in accordance therewith provide a first plurality of selectively variable bias currents; and a four quadrant multiplier circuit coupled to said first plurality of variable current sources and said weighted filter signal path and configured to receive said first plurality of selectively variable bias currents and said first composite filtered and magnitude weighted data signal and in accordance therewith provide said second composite filtered and magnitude weighted data signal.

5. The apparatus of claim 4, wherein:

said multiplier circuit further comprises a second plurality of variable current sources configured to receive said adaptation control signal and in accordance therewith provide a second plurality of selectively variable bias currents;

said four quadrant multiplier circuit is further coupled to said second plurality of variable current sources and is further configured to receive said first and second pluralities of selectively variable bias currents and said first composite filtered and magnitude weighted data signal and in accordance therewith provide said second composite filtered and magnitude weighted data signal; and each one of said second plurality of selectively variable bias currents has a respective current magnitude which varies in proportion to said adaptation control signal and in accordance therewith controls additive noise in said four quadrant multiplier circuit.

6. The apparatus of claim 1, wherein said adaptive filter circuit comprises:

a unity gain signal path configured to receive and buffer said input data signal and in accordance therewith provide a buffered data signal;

a weighted filter signal path configured to receive, filter and magnitude weight said input data signal and in accordance therewith provide a first filtered and magnitude weighted data signal;

a multiplier circuit coupled to said weighted filter signal path and configured to receive and multiply said adaptation control signal and said first filtered and magnitude weighted data signal and in accordance therewith provide a second filtered and magnitude weighted data signal; and an output circuit coupled to said unity gain signal path and said multiplier circuit and configured to receive and combine said buffered data signal and said second filtered and magnitude weighted data signal and in accordance therewith provide a third filtered and magnitude weighted data signal as said equalized data signal.

7. The apparatus of claim 6, wherein said multiplier circuit comprises:

a first plurality of variable current sources configured to receive said adaptation control signal and in accordance therewith provide a first plurality of selectively variable bias currents; and a four quadrant multiplier circuit coupled to said first plurality of variable current sources and said weighted filter signal path and configured to receive said first plurality of selectively variable bias currents and said first filtered and magnitude weighted data signal and in accordance therewith provide said second filtered and magnitude weighted data signal.

8. The apparatus of claim 7, wherein:

said multiplier circuit further comprises a second plurality of variable current sources configured to receive said adaptation control signal and in accordance therewith provide a second plurality of selectively variable bias currents;

said four quadrant multiplier circuit is further coupled to said second plurality of variable current sources and is further configured to receive said first and second pluralities of selectively variable bias currents and said first composite filtered and magnitude weighted data signal and in accordance therewith provide said second composite filtered and magnitude weighted data signal; and each one of said second plurality of selectively variable bias currents has a respective current magnitude which varies in proportion to said adaptation control signal and in accordance therewith controls additive noise in said four quadrant multiplier circuit.

9. The apparatus of claim 1, wherein said multiple stage quantized feedback circuit comprises:

an ac coupling network configured to receive and ac couple said equalized data signal and in accordance therewith provide a first ac coupled equalized data signal;

a first voltage comparator coupled to said ac coupling network and configured to receive and slice said first ac coupled equalized data signal and in accordance therewith provide a dc coupled data estimate signal which includes a low frequency content;

a cross-over combiner coupled to said first voltage comparator and configured to receive said dc coupled data estimate signal and said equalized data signal, extract said low frequency content from said dc coupled data estimate signal, ac couple said equalized data signal and in accordance therewith provide a second ac coupled equalized data signal, and combine said low frequency content from said dc coupled data estimate signal with said second ac coupled equalized data signal and in accordance therewith provide a dc restored equalized data signal; and a second voltage comparator coupled to said cross-over combiner and configured to receive and slice said dc restored equalized data signal and in accordance therewith provide said recovered digital data signal.

10. The apparatus of claim 9, wherein said cross-over combiner comprises:

a capacitor coupled between said adaptive filter circuit and said second voltage comparator; and a resistor coupled between said first and second voltage comparators.

11. The apparatus of claim 1, wherein:

said multiple stage quantized feedback circuit comprises a comparator circuit which includes an input and an output; and said servo control circuit comprises:

a first filter coupled to said comparator circuit input and configured to receive therefrom and filter said equalized data signal and in accordance therewith provide a first filtered signal;

a first rectifier coupled to said first filter and configured to receive and rectify said first filtered signal and in accordance therewith provide a first rectified signal;

a second filter coupled to said comparator circuit output and configured to receive therefrom and filter one of said dc coupled data estimate and recovered digital data signals and in accordance therewith provide a second filtered signal;

a second rectifier coupled to said second filter and configured to receive and rectify said second filtered signal and in accordance therewith provide a second rectified signal;

a signal combiner coupled to said first and second rectifiers and configured to receive and combine said first and second rectified signals and in accordance therewith provide a composite rectified signal; and an integrator coupled to said signal combiner and configured to integrate said composite rectified signal and in accordance therewith provide said adaptation control signal.

12. The apparatus of claim 11, wherein:

said first and second filters comprise first and second high pass filters;

said first and second rectifiers comprise first and second full wave rectifiers; and said signal combiner comprises a signal summer configured to difference said first and second rectified signals.

13. A method for use in adaptively equalizing and recovering data signals received via a communications path, said method comprising the steps of:

receiving an adaptation control signal and in accordance therewith receiving, filtering and magnitude weighting an input data signal corresponding to a plurality of data and in accordance therewith generating an equalized data signal corresponding to said plurality of data, wherein said input data signal is received via a communications path having a communications path transfer function associated therewith and, in accordance with said adaptation control signal, a frequency domain ratio of said equalized data signal to said input data signal represents an adaptive filter transfer function which is an approximate inverse of said communications path transfer function;

dc restoring said equalized data signal and in accordance therewith generating a dc coupled data estimate signal and a dc restored equalized data signal;

slicing said dc restored equalized data signal and in accordance therewith generating a recovered digital data signal representing said plurality of data;

filtering, rectifying and combining said equalized data signal and one of said dc coupled data estimate and recovered digital data signals and in accordance therewith generating a composite rectified signal; and integrating said composite rectified signal and in accordance therewith generating said adaptation control signal.

14. The method of claim 13, wherein said step of receiving an adaptation control signal and in accordance therewith receiving, filtering and magnitude weighting an input data signal corresponding to a plurality of data and in accordance therewith generating an equalized data signal corresponding to said plurality of data comprises:

receiving, filtering and magnitude weighting said input data signal in accordance with a plurality of filter transfer functions and in accordance therewith generating a plurality of filtered and magnitude weighted data signals;

combining said plurality of filtered and magnitude weighted data signals and in accordance therewith generating a first composite filtered and magnitude weighted data signal;

receiving and multiplying said first composite filtered and magnitude weighted data signal and said adaptation control signal and in accordance therewith generating a second composite filtered and magnitude weighted data signal; and combining said input data signal and said second composite filtered and magnitude weighted data signal and in accordance therewith generating a third composite filtered and magnitude weighted data signal as said equalized data signal.

15. The method of claim 14, wherein said step of receiving and multiplying said first composite filtered and magnitude weighted data signal and said adaptation control signal and in accordance therewith generating a second composite filtered and magnitude weighted data signal comprises:

receiving said adaptation control signal and in accordance therewith generating a first plurality of selectively variable bias currents; and receiving said first plurality of selectively variable bias currents and said first composite filtered and magnitude weighted data signal and in accordance therewith generating said second composite filtered and magnitude weighted data signal.

16. The method of claim 15, wherein said step of receiving and multiplying said first composite filtered and magnitude weighted data signal and said weight adaptation control signal and in accordance therewith generating a second composite filtered and magnitude weighted data signal comprises:

receiving said adaptation control signal and in accordance therewith generating first and second pluralities of selectively variable bias currents, wherein each one of said second plurality of selectively variable bias currents has a respective current magnitude which varies in proportion to said adaptation control signal;

selectively varying in proportion to said adaptation control signal said respective current magnitudes of each one of said second plurality of selectively variable bias currents and in accordance therewith controlling additive noise during said step of receiving and multiplying said first composite filtered and magnitude weighted data signal and said adaptation control signal and in accordance therewith generating a second composite filtered and magnitude weighted data signal; and receiving said first and second pluralities of selectively variable bias currents and said first composite filtered and magnitude weighted data signal and in accordance therewith generating said second composite filtered and magnitude weighted data signal.

17. The method of claim 13, wherein said step of dc restoring said equalized data signal and in accordance therewith generating a dc coupled data estimate signal and a dc restored equalized data signal comprises:

ac coupling said equalized data signal and in accordance therewith generating a first ac coupled equalized data signal;

slicing said first ac coupled equalized data signal and in accordance therewith generating a dc coupled data estimate signal which includes a low frequency content;

receiving said dc coupled data estimate signal and said equalized data signal;

extracting said low frequency content from said dc coupled data estimate signal;

ac coupling said equalized data signal and in accordance therewith generating a second ac coupled equalized data signal; and combining said low frequency content from said dc coupled data estimate signal with said second ac coupled equalized data signal and in accordance therewith generating a dc restored equalized data signal.

18. The method of claim 13, wherein said step of filtering, rectifying and combining said equalized data signal and one of said dc coupled data estimate and recovered digital data signals and in accordance therewith generating a composite rectified signal comprises:

coupling to an input of a comparator circuit and receiving therefrom and filtering an equalized data signal and in accordance therewith generating a first filtered signal, wherein said equalized data signal corresponds to a plurality of data and has been filtered and magnitude weighted by an adaptive filter in accordance with an adaptation control signal;

rectifying said first filtered signal and in accordance therewith generating a first rectified signal;

coupling to an output of said comparator circuit and receiving therefrom and filtering a quantized signal and in accordance therewith generating a second filtered signal, wherein said quantized signal corresponds to said equalized data signal following quantization thereof by said comparator circuit;

rectifying said second filtered signal and in accordance therewith generating a second rectified signal; and combining said first and second rectified signals and in accordance therewith generating a composite rectified signal.

19. An apparatus including an adaptive filter circuit for use in adaptively equalizing data signals received via a communications path, said adaptive filter circuit comprising:

a plurality of magnitude weighted filter stages coupled in parallel, having a plurality of filter transfer functions associated therewith and configured to receive, filter and magnitude weight an input data signal and in accordance therewith provide a plurality of filtered and magnitude weighted data signals;

a first signal combiner coupled to said plurality of magnitude weighted filter stages and configured to receive and combine said plurality of filtered and magnitude weighted data signals and in accordance therewith provide a first composite filtered and magnitude weighted data signal;

a signal multiplier coupled to said first signal combiner and configured to receive and multiply said first composite filtered and magnitude weighted data signal and an adaptation control signal and in accordance therewith provide a second composite filtered and magnitude weighted data signal; and a second signal combiner coupled to said signal multiplier and configured to receive and combine said input data signal and said second composite filtered and magnitude weighted data signal and in accordance therewith provide a third composite filtered and magnitude weighted data signal;

wherein said input data signal is received via a communications path having a communications path transfer function associated therewith and, in accordance with said adaptation control signal, a frequency domain ratio of said third composite filtered and magnitude weighted data signal to said input data signal represents an adaptive filter transfer function which is an inverse of said communications path transfer function.

20. The apparatus of claim 19, wherein said plurality of filter transfer functions comprises a plurality of high pass filter transfer functions.

21. The apparatus of claim 20, wherein individual ones of said plurality of high pass filter transfer functions have different corner frequencies.

22. The apparatus of claim 19, wherein said plurality of magnitude weighted filter stages, said first signal combiner, said signal multiplier and said second signal combiner together comprise:

a unity gain signal path configured to receive and buffer said input data signal and in accordance therewith provide a buffered data signal;

a weighted filter signal path configured to receive, filter and magnitude weight said input data signal and in accordance therewith provide said first composite filtered and magnitude weighted data signal;

a multiplier circuit coupled to said weighted filter signal path and configured to receive and multiply said adaptation control signal and said first composite filtered and magnitude weighted data signal and in accordance therewith provide said second composite filtered and magnitude weighted data signal; and an output circuit coupled to said unity gain signal path and said multiplier circuit and configured to receive and combine said buffered data signal and said second composite filtered and magnitude weighted data signal and in accordance therewith provide said third composite filtered and magnitude weighted data signal.

23. The apparatus of claim 22, wherein said weighted filter signal path comprises a plurality of high pass filter circuits.

24. The apparatus of claim 22, wherein said multiplier circuit comprises:

a first plurality of variable current sources configured to receive said adaptation control signal and in accordance therewith provide a first plurality of selectively variable bias currents; and a four quadrant multiplier circuit coupled to said first plurality of variable current sources and said weighted filter signal path and configured to receive said first plurality of selectively variable bias currents and said first composite filtered and magnitude weighted data signal and in accordance therewith provide said second composite filtered and magnitude weighted data signal.

25. The apparatus of claim 24, wherein:

said multiplier circuit further comprises a second plurality of variable current sources configured to receive said adaptation control signal and in accordance therewith provide a second plurality of selectively variable bias currents;

said four quadrant multiplier circuit is further coupled to said second plurality of variable current sources and is further configured to receive said first and second pluralities of selectively variable bias currents and said first composite filtered and magnitude weighted data signal and in accordance therewith provide said second composite filtered and magnitude weighted data signal; and each one of said second plurality of selectively variable bias currents has a respective current magnitude which varies in proportion to said adaptation control signal and in accordance therewith controls additive noise in said four quadrant multiplier circuit.

26. An apparatus including an integrated adaptive filter circuit for use in adaptively equalizing data signals received via a communications path, said integrated adaptive filter circuit comprising:

a unity gain signal path configured to receive and buffer an input data signal and in accordance therewith provide a buffered data signal;

a weighted filter signal path configured to receive, filter and magnitude weight said input data signal and in accordance therewith provide a first filtered and magnitude weighted data signal;

a multiplier circuit coupled to said weighted filter signal path and configured to receive and multiply an adaptation control signal and said first filtered and magnitude weighted data signal and in accordance therewith provide a second filtered and magnitude weighted data signal; and an output circuit coupled to said unity gain signal path and said multiplier circuit and configured to receive and combine said buffered data signal and said second filtered and magnitude weighted data signal and in accordance therewith provide a third filtered and magnitude weighted data signal;

wherein said input data signal is received via a communications path having a communications path transfer function associated therewith and, in accordance with said adaptation control signal, a frequency domain ratio of said third filtered and magnitude weighted data signal to said input data signal represents an adaptive filter transfer function which is an inverse of said communications path transfer function.

27. The apparatus of claim 26, wherein said weighted filter signal path comprises plurality of high pass filter circuits.

28. The apparatus of claim 26, wherein said weighted filter signal path has a high pass filter transfer function associated therewith.

29. The apparatus of claim 28, wherein said high pass filter transfer function includes a plurality of corner frequencies.

30. The apparatus of claim 26, wherein said multiplier circuit comprises:

a first plurality of variable current sources configured to receive said adaptation control signal and in accordance therewith provide a first plurality of selectively variable bias currents; and a four quadrant multiplier circuit coupled to said first plurality of variable current sources and said weighted filter signal path and configured to receive said first plurality of selectively variable bias currents and said first filtered and magnitude weighted data signal and in accordance therewith provide said second filtered and magnitude weighted data signal.

31. The apparatus of claim 30, wherein:

said multiplier circuit further comprises a second plurality of variable current sources configured to receive said adaptation control signal and in accordance therewith provide a second plurality of selectively variable bias currents;

said four quadrant multiplier circuit is further coupled to said second plurality of variable current sources and is further configured to receive said first and second pluralities of selectively variable bias currents and said first composite filtered and magnitude weighted data signal and in accordance therewith provide said second composite filtered and magnitude weighted data signal; and each one of said second plurality of selectively variable bias currents has a respective current magnitude which varies in proportion to said adaptation control signal and in accordance therewith controls additive noise in said four quadrant multiplier circuit.

32. A method for use in adaptively equalizing data signals received via a communications path, said method comprising the steps of:

receiving, filtering and magnitude weighting an input data signal in accordance with a plurality of filter transfer functions and in accordance therewith generating a plurality of filtered and magnitude weighted data signals;

combining said plurality of filtered and magnitude weighted data signals and in accordance therewith generating a first composite filtered and magnitude weighted data signal;

receiving and multiplying said first composite filtered and magnitude weighted data signal and an adaptation control signal and in accordance therewith generating a second composite filtered and magnitude weighted data signal; and combining said input data signal and said second composite filtered and magnitude weighted data signal and in accordance therewith generating a third composite filtered and magnitude weighted data signal;

wherein said input data signal is received via a communications path having a communications path transfer function associated therewith and, in accordance with said adaptation control signal, a frequency domain ratio of said third composite filtered and magnitude weighted data signal to said input data signal represents an adaptive filter transfer function which is an inverse of said communications path transfer function.

33. The method of claim 32, wherein said step of receiving and multiplying said first composite filtered and magnitude weighted data signal and an adaptation control signal and in accordance therewith generating a second composite filtered and magnitude weighted data signal comprises:

receiving said adaptation control signal and in accordance therewith generating a first plurality of selectively variable bias currents; and receiving said first plurality of selectively variable bias currents and said first composite filtered and magnitude weighted data signal and in accordance therewith generating said second composite filtered and magnitude weighted data signal.

34. The method of claim 33, wherein said step of receiving and multiplying said first composite filtered and magnitude weighted data signal and an adaptation control signal and in accordance therewith generating a second composite filtered and magnitude weighted data signal comprises:

receiving said adaptation control signal and in accordance therewith generating first and second pluralities of selectively variable bias currents, wherein each one of said second plurality of selectively variable bias currents has a respective current magnitude;

selectively varying in proportion to said adaptation control signal said respective current magnitudes of each one of said second plurality of selectively variable bias currents and in accordance therewith controlling additive noise during said step of receiving and multiplying said first composite filtered and magnitude weighted data signal and an adaptation control signal and in accordance therewith generating a second composite filtered and magnitude weighted data signal; and receiving said first and second pluralities of selectively variable bias currents and said first composite filtered and magnitude weighted data signal and in accordance therewith generating said second composite filtered and magnitude weighted data signal.

35. An apparatus including a multiple stage quantized feedback circuit for use in recovering data signals, said multiple stage quantized feedback circuit comprising:

an ac coupling network configured to receive and ac couple an equalized data signal corresponding to a plurality of data and in accordance therewith provide a first ac coupled equalized data signal;

a first voltage comparator coupled to said ac coupling network and configured to receive and slice said first ac coupled equalized data signal and in accordance therewith provide a dc coupled data estimate signal which includes a low frequency content;

a cross-over combiner coupled to said first voltage comparator and configured to receive said dc coupled data estimate signal and said equalized data signal, extract said low frequency content from said de coupled data estimate signal, ac couple said equalized data signal and in accordance therewith provide a second ac coupled equalized data signal, and combine said low frequency content from said dc coupled data estimate signal with said second ac coupled equalized data signal and in accordance therewith provide a dc restored equalized data signal; and a second voltage comparator coupled to said cross-over combiner and configured to receive and slice said dc restored equalized data signal and in accordance therewith provide a recovered digital data signal representing said plurality of data.

36. The apparatus of claim 35, wherein said ac coupling network, said first voltage comparator, said cross-over combiner and said second voltage comparator comprise a differential ac coupling network, a first differential voltage comparator, a differential cross-over combiner and a second differential voltage comparator, respectively, and said equalized data signal, said first ac coupled equalized data signal, said dc coupled data estimate signal, said second ac coupled equalized data signal, said dc restored equalized data signal and said recovered digital data signal comprise a differential equalized data signal, a first differential ac coupled equalized data signal, a differential dc coupled data estimate signal, a second differential ac coupled equalized data signal, a differential dc restored equalized data signal and a differential recovered digital data signal, respectively.

37. The apparatus of claim 35, wherein said cross-over combiner comprises:

a capacitor configured to receive and ac couple said equalized data signal to said second voltage comparator as said second ac coupled equalized data signal; and a resistor coupled between said first and second voltage comparators.

38. A method for use in recovering data signals, said method comprising the steps of:

receiving an equalized data signal corresponding to a plurality of data;

ac coupling said equalized data signal and in accordance therewith generating a first ac coupled equalized data signal;

slicing said first ac coupled equalized data signal and in accordance therewith generating a de coupled data estimate signal which includes a low frequency content;

extracting said low frequency content from said dc coupled data estimate signal;

ac coupling said equalized data signal and in accordance therewith generating a second ac coupled equalized data signal;

combining said low frequency content from said dc coupled data estimate signal with said second ac coupled equalized data signal and in accordance therewith generating a dc restored equalized data signal; and slicing said dc restored equalized data signal and in accordance therewith generating a recovered digital data signal representing said plurality of data.

39. The method of claim 38, wherein:

said step of receiving an equalized data signal corresponding to a plurality of data comprises receiving a differential equalized data signal corresponding to said plurality of data;

said step of ac coupling said equalized data signal and in accordance therewith generating a first ac coupled equalized data signal comprises ac coupling said differential equalized data signal and in accordance therewith generating a first ac coupled differential equalized data signal;

said step of slicing said first ac coupled equalized data signal and in accordance therewith generating a dc coupled data estimate signal which includes a low frequency content comprises slicing said first ac coupled differential equalized data signal and in accordance therewith generating a dc coupled differential data estimate signal which includes a low frequency content;

said step of extracting said low frequency content from said dc coupled data estimate signal comprises extracting said low frequency content from said dc coupled differential data estimate signal;

said step of ac coupling said equalized data signal and in accordance therewith generating a second ac coupled equalized data signal comprises ac coupling said differential equalized data signal and in accordance therewith generating a second ac coupled differential equalized data signal;

said step of combining said low frequency content from said dc coupled data estimate signal with said second ac coupled equalized data signal and in accordance therewith generating a dc restored equalized data signal comprises combining said low frequency content from said dc coupled differential data estimate signal with said second ac coupled differential equalized data signal and in accordance therewith generating a dc restored differential equalized data signal; and said step of slicing said dc restored equalized data signal and in accordance therewith generating a recovered digital data signal representing said plurality of data comprises slicing said dc restored differential equalized data signal and in accordance therewith generating a differential recovered digital data signal representing said plurality of data.

40. The method of claim 38, wherein:

said step of extracting said low frequency content from said dc coupled data estimate signal comprises filtering said low frequency content from said dc coupled data estimate signal with a resistor and a capacitor;

said step of ac coupling said equalized data signal and in accordance therewith generating a second ac coupled equalized data signal comprises ac coupling said equalized data signal and in accordance therewith generating said second ac coupled equalized data signal with said capacitor; and said step of combining said low frequency content from said dc coupled data estimate signal with said second ac coupled equalized data signal and in accordance therewith generating a dc restored equalized data signal comprises combining said low frequency content from said dc coupled data estimate signal with said second ac coupled equalized data signal and in accordance therewith generating a dc restored equalized data signal with said resistor and capacitor.

41. An apparatus including a servo control circuit for use in adaptively equalizing and recovering data signals, said servo control circuit comprising:

a first filter configured to be coupled to an input of a comparator circuit and receive therefrom and filter an equalized data signal and in accordance therewith provide a first filtered signal, wherein said equalized data signal corresponds to a plurality of data and has been filtered and magnitude weighted by an adaptive filter in accordance with an adaptation control signal;

a first rectifier coupled to said first filter and configured to receive and rectify said first filtered signal and in accordance therewith provide a first rectified signal;

a second filter configured to be coupled to an output of said comparator circuit and receive therefrom and filter a quantized signal and in accordance therewith provide a second filtered signal, wherein said quantized signal corresponds to said equalized data signal following quantization thereof by said comparator circuit;

a second rectifier coupled to said second filter and configured to receive and rectify said second filtered signal and in accordance therewith provide a second rectified signal;

a signal combiner coupled to said first and second rectifiers and configured to receive and combine said first and second rectified signals and in accordance therewith provide a composite rectified signal; and an integrator coupled to said signal combiner and configured to integrate said composite rectified signal and in accordance therewith provide said adaptation control signal.

42. The apparatus of claim 41, wherein said first and second filters comprise first and second high pass filters.

43. The apparatus of claim 41, wherein said first and second rectifiers comprise first and second full wave rectifiers.

44. The apparatus of claim 41, wherein said signal combiner comprises a signal summer configured to difference said first and second rectified signals.

45. The apparatus of claim 41, wherein said equalized data signal and said quantized signal comprise a differential equalized data signal and a differential quantized signal, respectively.

46. The apparatus of claim 41, wherein said quantized signal comprises a dc coupled data estimate signal.

47. The apparatus of claim 41, wherein said quantized signal comprises a dc restored and sliced digital data signal representing said plurality of data.

48. A method for use in adaptively equalizing and recovering data signals, said method comprising the steps of:

coupling to an input of a comparator circuit and receiving therefrom and filtering an equalized data signal and in accordance therewith generating a first filtered signal, wherein said equalized data signal corresponds to a plurality of data and has been filtered and magnitude weighted by an adaptive filter in accordance with an adaptation control signal;

rectifying said first filtered signal and in accordance therewith generating a first rectified signal;

coupling to an output of said comparator circuit and receiving therefrom and filtering a quantized signal and in accordance therewith generating a second filtered signal, wherein said quantized signal corresponds to said equalized data signal following quantization thereof by said comparator circuit;

rectifying said second filtered signal and in accordance therewith generating a second rectified signal;

combining said first and second rectified signals and in accordance therewith generating a composite rectified signal; and integrating said composite rectified signal and in accordance therewith generating said adaptation control signal.

49. The method of claim 48, wherein:

said step of coupling to an input of a comparator circuit and receiving therefrom and filtering an equalized data signal and in accordance therewith generating a first filtered signal comprises high pass filtering said equalized data signal;

said step of rectifying said first filtered signal and in accordance therewith generating a first rectified signal comprises full wave rectifying said first filtered signal;

said step of coupling to an output of said comparator circuit and receiving therefrom and filtering a quantized signal and in accordance therewith generating a second filtered signal comprises high pass filtering said quantized signal;

said step of rectifying said second filtered signal and in accordance therewith generating a second rectified signal comprises full wave rectifying said second filtered signal; and said step of combining said first and second rectified signals and in accordance therewith generating a composite rectified signal comprises differencing said first and second rectified signals.

50. The method of claim 48, wherein:

said step of coupling to an input of a comparator circuit and receiving therefrom and filtering an equalized data signal and in accordance therewith generating a first filtered signal comprises receiving a differential equalized data signal; and said step of coupling to an output of said comparator circuit and receiving therefrom and filtering a quantized signal and in accordance therewith generating a second filtered signal comprises receiving a differential quantized signal.

* * * * *

UNITED STATES PATENT AND TRADEMARK OFFICE
CERTIFICATE OF CORRECTION

PATENT NO.: 5,978,417
DATED: November 2, 1999
INVENTOR(S): Alan J. Baker et al.

It is certified that errors appear in the above-identified patent and that said Letters Patent is hereby corrected as shown below:

In Col. 8, line 8, delete "de" and replace with --dc--.

In Col. 15, line 25 after "comprises" insert --a--.

In Col. 17, line 13, delete "de" and replace with --dc--.

In Col. 17, line 58, delete "de" and replace with --dc--.

Signed and Sealed this

Ninth Day of May, 2000

Q. TODD DICKINSON

*Attest:*

*Attesting Officer*　　　*Director of Patents and Trademarks*